(12) United States Patent
Yoon et al.

(10) Patent No.: US 12,441,374 B2
(45) Date of Patent: Oct. 14, 2025

(54) OHT VEHICLE TRACTION DEVICE AND METHOD FOR RECOVERYING MALFUNCTIONED VEHICLE

(71) Applicant: SEMES CO., LTD., Cheonan-si (KR)

(72) Inventors: Ki Sub Yoon, Suwon-si (KR); Ji Yoon Jung, Ansan-si (KR)

(73) Assignee: SEMES CO., LTD., Cheonan-si (KR)

( * ) Notice: Subject to any disclaimer, the term of this patent is extended or adjusted under 35 U.S.C. 154(b) by 1045 days.

(21) Appl. No.: 17/494,717

(22) Filed: Oct. 5, 2021

(65) Prior Publication Data

US 2022/0106169 A1 Apr. 7, 2022

(30) Foreign Application Priority Data

Oct. 6, 2020 (KR) ........................ 10-2020-0128814

(51) Int. Cl.
| | | |
|---|---|---|
| *B61B 3/02* | (2006.01) | |
| *B65G 1/04* | (2006.01) | |
| *B66C 11/04* | (2006.01) | |
| *B66C 13/48* | (2006.01) | |
| *B66C 15/04* | (2006.01) | |
| *H01L 21/677* | (2006.01) | |
| *H02J 50/10* | (2016.01) | |

(52) U.S. Cl.
CPC .............. *B61B 3/02* (2013.01); *B65G 1/0421* (2013.01); *B66C 11/04* (2013.01); *B66C 13/48* (2013.01); *B66C 15/04* (2013.01); *H01L 21/67733* (2013.01); *H02J 50/10* (2016.02); *H01L 21/6773* (2013.01)

(58) Field of Classification Search
CPC ......... B66C 13/48; B66C 11/04; B66C 15/04; B61B 3/02; B65G 1/0421; B65G 1/0457; B65G 2201/0297; H01L 21/67733; H01L 21/6773; H01L 21/34406; H01L 21/67724; H01L 21/67703; H01L 21/677; H01L 21/67745; H02J 50/00; H02J 50/10; B60D 1/01; B60D 1/04; B60D 1/145; B60D 1/155; B60D 1/173; B60D 1/249; B60D 1/54
USPC ........................................................... 104/89
See application file for complete search history.

(56) References Cited

U.S. PATENT DOCUMENTS

| | | | | |
|---|---|---|---|---|
| 1,375,056 | A * | 4/1921 | McMinn ................ | B60D 1/155 |
| | | | | 267/72 |
| 6,634,845 | B1 * | 10/2003 | Komino ............ | H01L 21/67745 |
| | | | | 414/217 |
| 2016/0152450 | A1 * | 6/2016 | Murakami ................ | B66C 9/04 |
| | | | | 212/328 |

FOREIGN PATENT DOCUMENTS

| | | | |
|---|---|---|---|
| JP | 2000188319 A | * | 7/2000 |
| JP | 2015081017 A | * | 4/2015 |

(Continued)

OTHER PUBLICATIONS

Office Action from the Korean Intellectual Property Office dated Dec. 15, 2022.

*Primary Examiner* — S. Joseph Morano
*Assistant Examiner* — Heaven R Buffington

(57) ABSTRACT

Proposed are an OHT (overhead hoist transport) vehicle traction device and a method of managing an OHT system using same. The OHT vehicle traction device may solve problems of a driving-malfunction vehicle on the rails of an OHT system or tows the vehicle, and the method of managing the OHT system may increase the management efficiency of the entire OHT system by solving problems of a driving-malfunction vehicle or towing the vehicle in an unmanned type.

10 Claims, 22 Drawing Sheets

(56) References Cited

FOREIGN PATENT DOCUMENTS

| KR | 10-2003-0068328 | 8/2003 |
| KR | 10-1743465 | 5/2017 |
| KR | 10-2020-0039229 | 4/2020 |

* cited by examiner

OHT VEHICLE TRACTION DEVICE AND METHOD FOR RECOVERYING MALFUNCTIONED VEHICLE

CROSS REFERENCE TO RELATED APPLICATION

The present application claims priority to Korean Patent Application No. 10-2020-0128814, filed Oct. 6, 2020, the entire contents of which is incorporated herein for all purposes by this reference.

BACKGROUND OF THE INVENTION

Field of the Invention

The present disclosure relates to an OHT (overhead hoist transport) vehicle traction device and a method of managing an OHT system using same. Particularly, the present disclosure relates to an OHT vehicle traction device which solves problems of a driving-malfunction vehicle on the rails of an OHT system or tows the vehicle, and a method of managing an OHT system which increases the management efficiency of the entire OHT system by solving problems of a driving-malfunction vehicle or towing the vehicle in an unmanned type.

Description of the Related Art

The process of producing semiconductor products is composed of tens of processes to obtain complete products and movement of materials occurs hundreds of thousands of times in the process of manufacturing semiconductors. Overhead Hoist Transfer (OHT) is used as an automated transport system in semiconductor manufacturing lines to prevent damage and contamination of semiconductor materials, delivery accidents, etc. in the transport process. The OHT, which is a system that automates transport between semiconductor processes, carries wafers in Front Opening Unified Pods (FOUP) to the manufacturing facility for each manufacturing process along rails installed on the ceiling.

FIGS. 1A and 1B schematically show the configuration of an automated transport system employing OHT.

An OHT vehicle 10 is interfaced with an OHT Control System (OCS) 20, which gives transport instructions while moving on rails 40 installed on a ceiling, in a wireless communication type. The OCS 20 receives instructions of transport depending on processes from a Material Control System (MCS) 30, and searches out the shortest path from the departure point to the destination to complete transport to the OHT vehicle 10 within the shortest time, selects an OHT at an optimal location suitable for transport, and transmits a transport instruction to the OHT, in accordance with orders from the MCS 30. The OHT vehicle 10 delivers a material from a predetermined port to a destination port designated by the OCS 20 in accordance with the transport order of the OCS 20.

When an OHT performs transport in accordance with a transport instruction, in order to secure reliability and safety in the delivery by the OHT such as preventing a collision of OHT vehicle, a delivery accident, etc., the controller of the OHT monitors the operation of the OHT vehicles and precisely controls the OHT vehicle in detail on the basis of speed information, location information, etc.

Various malfunctions may be generated while OHT vehicles are driven and such malfunctions may cause severe accidents in transport by the OHT vehicles. Accordingly, when a malfunction is generated while an OHT vehicle is driven, the controller of the OHT stops the OHT vehicle by operating the brake of the OHT vehicle.

When a specific OHT vehicle is stopped due to a malfunction while tens to hundreds of OHT vehicles are simultaneously operated on the rails of an OHT system, it causes a series of operational problems such as slowing down or stopping other OHT vehicles driven around the malfunctioning OHT vehicle, whereby the efficiency and performance of the entire OHT system are deteriorated.

Various technologies for solving problems with a driving-malfunction OHT vehicle have been proposed in the related art. However, in order to restart or tow an OHT vehicle stopped by operation of a brake, a worker has to manually reset the OHT by separately supplying power to the OHT and separate the brake.

FIG. 2 shows a situation in which a worker solves a problem with a driving-malfunction vehicle according to the related art.

When an OHT vehicle 10 is stopped by operation of the brake due to a malfunction while it is driven, a manager comes to the driving-malfunction vehicle 10 and solves the problem. However, since the OHT vehicle 10 is stopped on the rail installed at a predetermined height in the air, the manager solves the problem by operating a reset switch of a terminal unit 60 of the driving-malfunction vehicle 10 using a long rod, etc.

If the OHT cannot be normally operated after reset, the OHT vehicle is recovered to a repair place. In order to recover the OHT vehicle, the manager manually fastens a traction jig to the driving-malfunction vehicle or pushes the driving-malfunction vehicle from behind using another OHT vehicle.

According to the technologies of the related art, when a driving-malfunction vehicle is stopped at a location that a manager has difficult in reaching, it is difficult to reset the driving-malfunction vehicle or fasten a traction jig. Further, according to the method of recovering a driving-malfunction vehicle by pushing the driving-malfunction vehicle from behind, since the driving-malfunction vehicle enters first a bend, the steering device of the driving-malfunction vehicle is not controlled at appropriate timing.

Documents of Related Art (Patent Document 1) Korean Patent No. 10-1743465

SUMMARY OF THE INVENTION

The present disclosure has been made in an effort to solve the problems in the related art and an objective of the present disclosure is to provide a method of solving a problem of a driving-malfunction vehicle having the problem on the rail of an OHT system in an unmanned type using an OHT vehicle traction device or of towing the driving-malfunction vehicle.

In particular, another objective of the present disclosure is to solve the problem that when a driving-malfunction vehicle is stopped at a location that a manager has difficulty in reaching, it is difficult to reset the driving-malfunction vehicle or fasten a traction jig.

Another objective of the present disclosure is to solve the problem that, in a method of recovering a driving-malfunction vehicle by pushing the driving-malfunction vehicle from behind, since the driving-malfunction vehicle enters first a bend, the steering device of the driving-malfunction vehicle is not controlled at an appropriate timing.

In order to achieve the objectives of the present disclosure, an OHT vehicle traction device according to the present disclosure includes: a moving unit configured to be driven on a rail of an OHT system; a wireless power supply unit configured to wirelessly provide power to a driving-malfunction vehicle having a wireless power input unit; and a malfunction vehicle control unit configured to: wirelessly reset a controller of the driving-malfunction vehicle having a wireless control communication module; and check whether the controller of the driving-malfunction vehicle is normally operated.

The OHT vehicle traction device may further include one of a traction unit and a traction jig fastener configured to be engaged with the other of the traction unit and traction jig fastener at the driving-malfunction vehicle to tow the driving-malfunction vehicle using the traction unit and the traction jig fastener engaged with each other, wherein the malfunction vehicle control unit is configured to: control the traction unit; control the wireless power supply unit to wirelessly supply power to the driving-malfunction vehicle; and control the driving-malfunction vehicle via the wireless control communication module so that a brake of the driving-malfunction vehicle is released and a steering device of the driving-malfunction vehicle is controlled.

The traction unit may further include: a traction jig controller. The traction unit comprises a traction support member protruding forward, and a traction jig mounted at an end of the traction support member and configured to be fastened to a traction jig fastener. The malfunction vehicle control unit controls the traction jig controller to couple or uncouple the traction jig to or from the traction jig fastener.

The traction jig may include an electromagnetic jig configured to generate magnetism and to be coupled to a traction jig fastener made of metal when power is applied, and the traction jig controller may control the electromagnetic jig to be fastened and unfastened by supplying power.

The traction jig may include: a hooked jig configured to be fastened to a ring-shaped traction jig fastener; and a rotary jig joint connected to an end of the hooked jig and configured to fasten or separate the hooked jig to or from the traction jig fastener by rotating the hooked jig, and the traction jig controller may control rotation of the rotary jig joint.

The traction jig may include a threaded jig having threads on an outer surface thereof to be fastened to a traction jig fastener recessed and having threads on an inner surface thereof, and the traction jig controller may control fastening or separating of the threaded jig by rotating the traction jig.

The traction jig includes a protruding jig inserted a protruding jig fastening portion of a traction jig fastener and accommodated into a jig fastening space of the traction jig fastener so that the traction jig and the traction jig fastener are engaged with each other. The traction jig controller controls engagement of the protruding jig or disengagement of the protruding jig by rotating the traction jig.

The traction support member may include a plurality of telescopic-type pipes configured to be pulled out and inserted in multiple stages, and the traction jig controller may pull out or insert the plurality of pipes of the traction support member in multiple stages.

The traction unit may further include a traction jig member room configured to receive and keep the traction support member, and the traction jig controller may control the traction support member pulled out of or inserted into the traction jig member room.

The traction support member may include a shock-absorbing member disposed at a middle portion or at an end of the traction support member and including an elastic member configured to absorb shock.

The traction support member may include a joint formed at a middle portion of the traction support member and configured to rotate left and right a portion of the traction support member.

The OHT vehicle traction device may be mounted on an OHT vehicle for transporting articles.

A method of managing an OHT system according to the present disclosure includes: approaching an OHT vehicle traction device to a driving-malfunction vehicle having a problem at a rail of the OHT system; wirelessly supplying power to a wireless power input unit of the driving-malfunction vehicle and wirelessly resetting a controller through a wireless control communication module of the driving-malfunction vehicle, by the OHT vehicle traction device; and checking whether the controller of the driving-malfunction vehicle is normally operated, by the OHT vehicle traction device.

The method may further include: coupling a traction unit and a traction jig fastener to each other by the OHT vehicle traction device; and towing the driving-malfunction vehicle through the traction unit and the traction jig fastener by the OHT vehicle traction device.

The towing of the driving-malfunction vehicle may include: releasing a brake through a wireless control communication module of the driving-malfunction vehicle by supplying power to a wireless power input unit of the driving-malfunction vehicle; and controlling a steering device through the wireless control communication module of the driving-malfunction vehicle while towing the driving-malfunction vehicle.

The approaching of an OHT vehicle traction device may include moving the OHT vehicle traction device to the driving-malfunction vehicle within a possible-coupling distance between the traction unit and the traction jig fastener, and the coupling of the traction unit and the traction jig fastener to each other may include: pulling out a traction support member from a traction support member room; and coupling a traction jig at an end of the traction support member to the traction jig fastener.

In the towing of the driving-malfunction vehicle, the steering device of the driving-malfunction vehicle is controlled in consideration of a bottleneck or a bend in a route from a location where the driving-malfunction vehicle is stopped to a destination where the driving-malfunction vehicle is to be repaired.

The method may further include recognizing a driving-malfunction vehicle having a problem and designating an OHT vehicle traction device by giving an instruction to the OHT vehicle traction device to solve the problem of the driving-malfunction vehicle by an OHT Control System (OCS).

The method may further include designating, by the OCS, a plurality of transport works to a plurality of OHT vehicles, respectively, wherein the plurality of OHT vehicles include a plurality of first type OHT vehicles having an OHT vehicle traction device and a plurality of second type OHT vehicles without an OHT vehicle traction device; and distributing, by the OCS, the plurality of first type OHT vehicles among the plurality of second type OHT vehicles at a predetermined ratio for each transport section, wherein the designating of the OHT vehicle traction device includes choosing one of the plurality first type OHT vehicle which is close to a driving-malfunction vehicle having a problem among the plurality of OHT vehicles.

An OHT vehicle traction device according to the present disclosure includes: a wireless power supply unit disposed at an OHT vehicle configured to transport articles, and configured to wirelessly provide power to a driving-malfunction vehicle; a traction unit coupled to the driving-malfunction vehicle and configured to allow the driving-malfunction vehicle to be towed; and a malfunction vehicle control unit configured to: control the wireless power supply unit to wirelessly supply power to the driving-malfunction vehicle; and control the driving-malfunction vehicle via a wireless control communication module thereof so that a controller of the driving-malfunction vehicle is wirelessly reset, a brake of the driving-malfunction vehicle is released, and a steering device of the driving-malfunction vehicle is controlled. The traction unit comprises: a traction support member; a hooked traction jig mounted at an end of the traction support member and having a hook to be engaged with a ring-shaped traction jig fastener of the driving-malfunction vehicle; a rotary jig joint configured to fasten or separate the hooked traction jig to or from the ring-shaped traction jig fastener of the driving-malfunction vehicle; and a traction jig controller configured to insert or pull-out of the traction jig member, and configured to control couple or uncouple the traction unit to or from the traction jig fastener of the driving-malfunction vehicle.

According to the present disclosure, it is possible to solve a problem of a driving-malfunction vehicle stopped on a rail of an OHT system due to the problem and to tow the driving-malfunction vehicle, using an OHT vehicle traction device.

According to an embodiment of the present disclosure, since the OHT vehicle traction device has the traction support member room, the traction support member is normally inserted and kept in the traction support member room, so it is possible to prevent the traction unit from being damaged or being interfered with by another object.

According to an embodiment of the present disclosure, since a hooked jig is applied, it is possible to easily fasten a traction unit and a traction jig fastener and it is possible to keep the jig stably fastened while towing.

According to an embodiment of the present disclosure, since an electromagnetic jig is applied, the traction unit and the traction jig coupler can be formed in simple structures and the jig can be more accurately coupled.

According to an embodiment of the present disclosure, since a threaded jig or a protruding jig is applied, as described above, it is possible to keep the jig stably fastened even if various types of shock are generated when the OHT vehicle traction device tows a driving-malfunction vehicle.

According to an embodiment of the present disclosure, since the traction support member is composed of a plurality of telescopic-type pipes that is inserted and pulled out in multiple stages, it is possible to keep the traction support member even if it is difficult to secure a space having a sufficient depth for the traction support member room due to a structural reason.

According to an embodiment of the present disclosure, since an OHT vehicle traction device wirelessly control a steering device of a driving-malfunction vehicle, it is possible to smoothly tow the driving-malfunction vehicle through a bend, etc.

According to an embodiment of the present disclosure, since a shock-absorbing member is applied, it is possible to more stably fasten the jig and more stably tow a driving-malfunction vehicle by absorbing shock that is generated when the jig is fastened or shock that is generated when a driving-malfunction vehicle is towed.

According to an embodiment of the present disclosure, since a joint is applied, when a driving-malfunction vehicle is towed, the joint is rotated left and right at a bend, so the driving-malfunction vehicle can be stably towed.

According to an embodiment of the present disclosure, since work is designated such that OHT vehicles having an OHT vehicle traction device and normal OHT vehicles are distributed within a predetermined ratio for each transport section in the present disclosure, when a problem is generated in an OHT vehicle, it is possible to solve the problem within a short time, so it is possible to increase the management efficiency of the entire OHT system.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Exemplary embodiments of the present disclosure are provided and referred to hereafter to describe the present disclosure, the operational advantages of the present disclosure, and objectives achieved by implementing the present disclosure.

First, terminologies used herein are provided only to describe specific embodiments without limiting the present disclosure, and similar forms may include plural forms unless clearly state otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

In describing the present disclosure, well-known functions or constructions will not be described in detail since they may unnecessarily obscure the understanding of the present disclosure.

The present disclosure proposes an OHT vehicle traction device having a new structure for solving problems of a driving-malfunction vehicle on the rails of an OHT system or for towing the driving-malfunction vehicle, and proposes a method of managing an OHT system for increasing the management efficiency of an entire OHT system by solving problems of a driving-malfunction vehicle or towing the driving-malfunction vehicle in an unmanned type using the OHT vehicle traction device.

An OHT vehicle traction device according to the present disclosure is described first and then a method of managing an OHT system employing the OHT vehicle traction device is described.

An OHT vehicle traction device according to the present disclosure, in a broad meaning, may include: a moving unit that is driven on the rails of an OHT system; a wireless power supply unit that wirelessly provides power to a driving-malfunction vehicle; and a malfunction vehicle control unit that wirelessly resets a controller of a driving-malfunction vehicle and checks whether the controller is normally operated. The OHT vehicle traction device may further include a towing unit or a traction jig fastener for towing a driving-malfunction vehicle.

The traction unit may include a traction support member, a traction jig, a traction jig controller, etc.

The traction support member protrudes forward and supports the traction jig, the traction jig is mounted at an end of the traction support member and is coupled to a traction jig fastener, and the traction jig controller can control coupling/uncoupling of the traction jig to/from the traction jig fastener.

The OHT vehicle traction device according to the present disclosure may be implemented as an individual device that is separate from OHT vehicle, but may be applied to OHT vehicle. In the following description, an OHT vehicle equipped with the OHT vehicle traction device is referred to as an OHT vehicle traction device for the convenience of description.

Figure 1A:
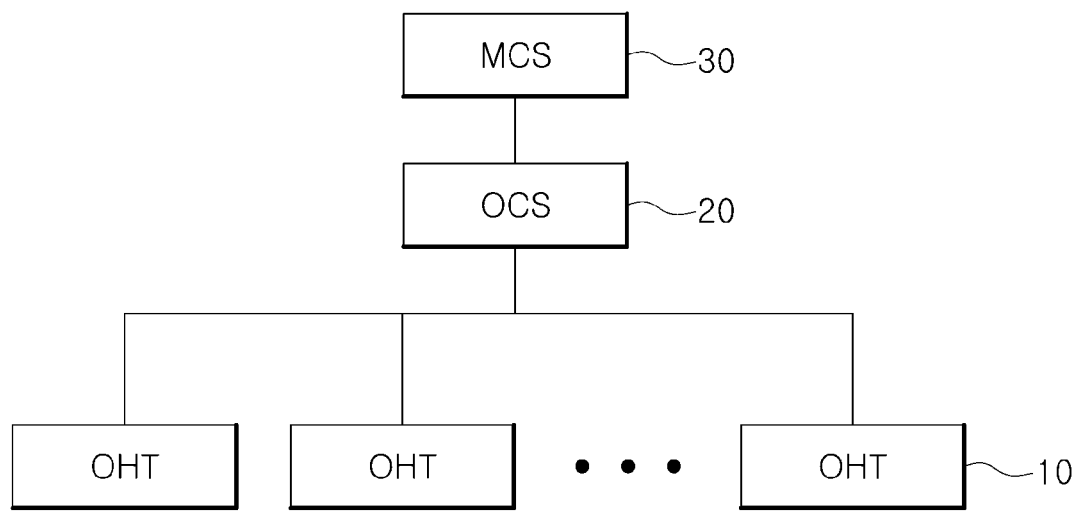
FIGS. 1A and 1B schematically show the configuration of an automated transport system employing OHT.
Figure 1B:
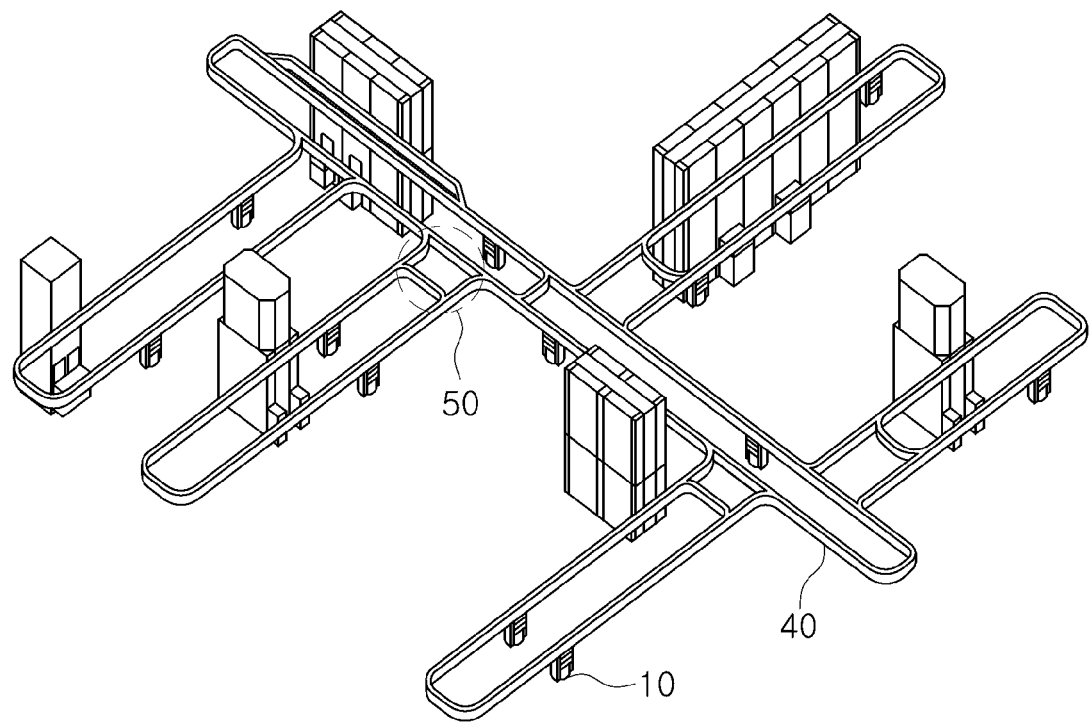
Figure 2:
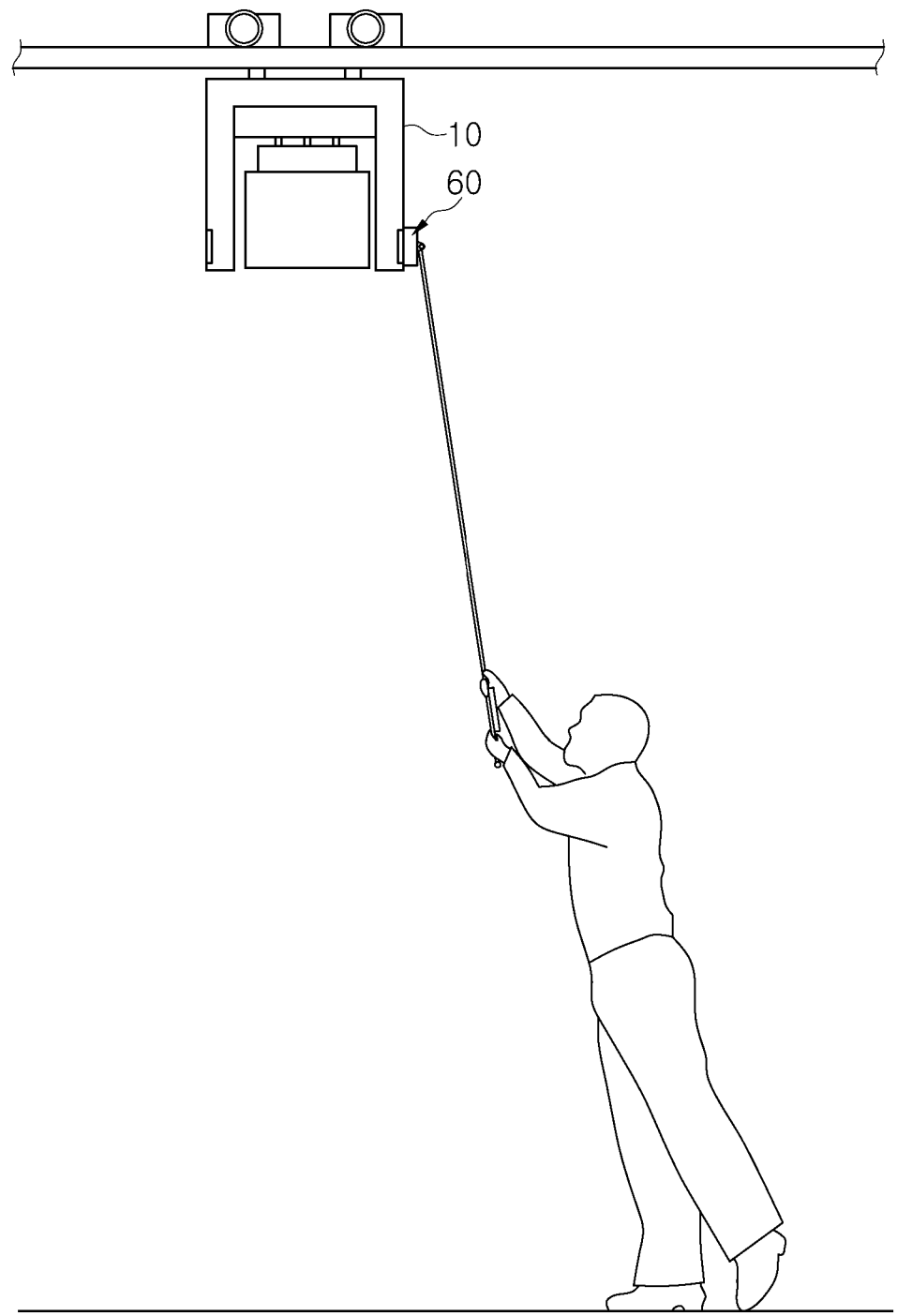
FIG. 2 shows a situation in which a worker solves a problem with a driving-malfunction vehicle according to the related art.
Figure 3:
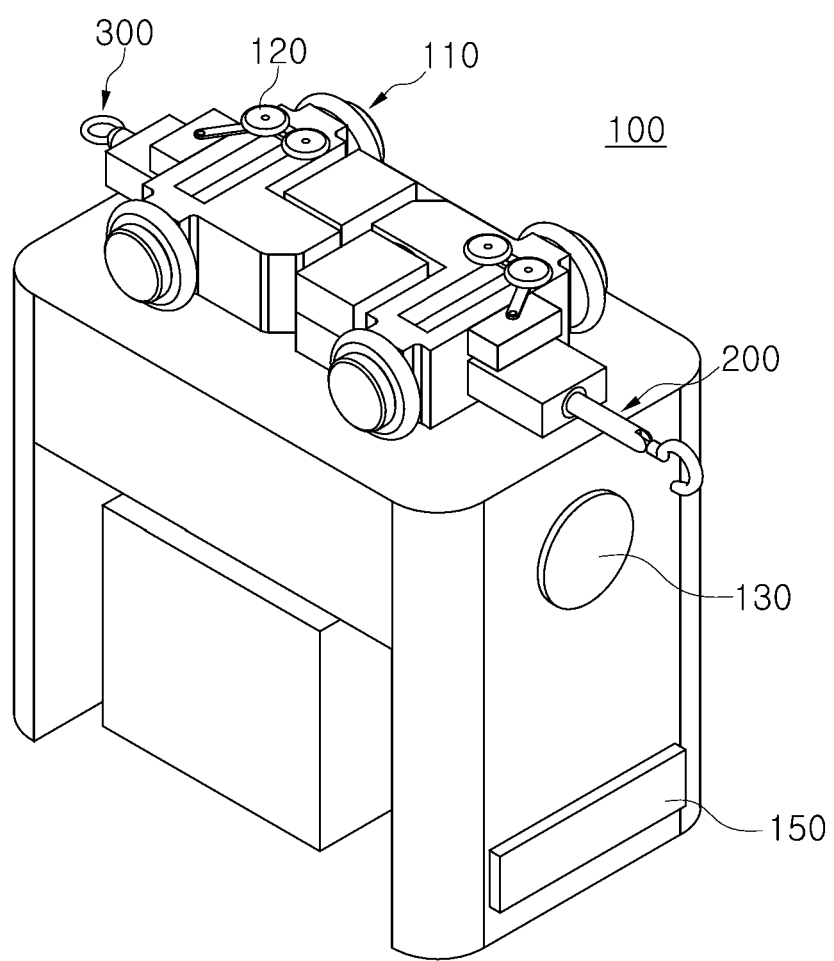
FIG. 3 shows an embodiment of an OHT vehicle equipped with an OHT vehicle traction device according to the present disclosure.

FIG. 3 shows an embodiment of an OHT vehicle equipped with an OHT vehicle traction device according to the present disclosure.

An OHT vehicle traction device 100 may include the fundamental configuration of a common OHT such as a moving unit 110 for driving on a rail and a steering device 120 preventing derailment from a rail at a bend of the rail and guiding a direction. Hereinafter, for the simplicity of description, an OHT vehicle with the OHT vehicle traction device may be referred to using the reference number 100.

The OHT vehicle traction device 100 includes a wireless power supply unit 130, a malfunction vehicle control unit 150, a traction unit 200, etc. to supply power and control traction for a driving-malfunction vehicle.

The wireless power supply unit 130 wirelessly supplies power at a distance close to a driving-malfunction vehicle. As the wireless power supply type, various wireless power transfer methods such as a magnetic induction type and a magnetic resonance type can be applied, and the detailed configuration for this type can be achieved by well-known technologies, so it is not described in detail.

The malfunction vehicle control unit 150 resets a driving-malfunction vehicle and checks whether the driving-malfunction vehicle is normally operated in a wireless communication type, and releases the brake and controls the steering device when a driving-malfunction vehicle is towed.

The traction unit 200 is installed on the OHT vehicle traction device 100 to be able to tow a driving-malfunction vehicle.

For example, when a driving-malfunction vehicle is towed from the front, the wireless power supply unit 130, the malfunction vehicle control unit 150, the traction unit 200, etc. may be disposed on the rear surface of the OHT vehicle traction device 100. Further, for corresponding to this configuration, a wireless power input unit, a wireless control communication module, a traction jig fastener, etc. may be disposed on the front surface of a driving-malfunction vehicle.

As another example, when a driving-malfunction vehicle is pushed from the rear, the wireless power supply unit 130, the malfunction vehicle control unit 150, the traction unit 200, etc. may be disposed on the front surface of the OHT vehicle traction device 100. Further, for corresponding to this configuration, a wireless power input unit, a wireless control communication module, a traction jig fastener, etc. may be disposed on the rear surface of a driving-malfunction vehicle.

Further, when the OHT vehicle traction device 100 stops on a rail due to a malfunction, components of a driving-malfunction vehicle to be described below, including a traction jig fastener 300 may be provided to be towed by another OHT vehicle traction device.

Although the OHT vehicle traction device 100 includes the traction unit 200 in FIG. 3, depending on situations, a driving-malfunction vehicle may have a traction unit and the OHT vehicle traction device 100 may have a traction jig fastener, which may be selectively changed.

The detailed configuration of the OHT vehicle traction device 100 is described through various embodiments.

Figure 4A:
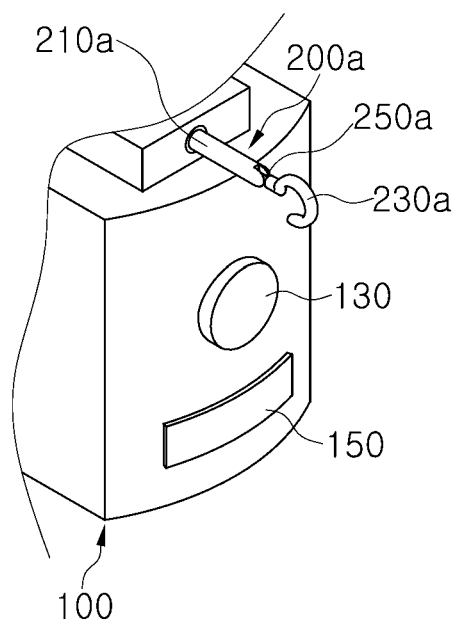
FIGS. 4A and 4B show an embodiment of a traction unit of the OHT vehicle traction device according to the present disclosure.
Figure 4B:
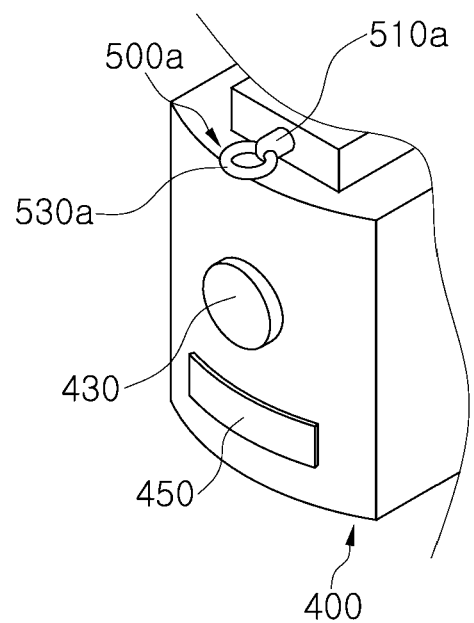

FIGS. 4A and 4B show an embodiment of a traction unit of the OHT vehicle traction device according to the present disclosure.

FIG. 4A shows an OHT vehicle traction device and FIG. 4B shows a driving-malfunction vehicle corresponding to the OHT vehicle traction device.

In an embodiment, a traction unit 200a having a hooked jig and a traction jig fastener 500a corresponding to the traction unit 200a are proposed.

The traction unit 200a of the OHT vehicle traction device 100 may include a traction support member 210a, a traction jig 230a, a rotary jig joint 250a.

The traction support member 210a, which is a member protruding toward a driving-malfunction vehicle so that the traction jig 230a can be fastened, has a length that can be adjusted such that wireless power supply is allowed and a driving-malfunction vehicle can be stably towed.

The hooked jig 230a is mounted at an end of the traction support member 210a as a traction jig, and the rotary jig joint 250a is disposed between the traction support member 210a and the hooked jig 230a.

The rotary jig joint 250a can rotate the hooked jig 230a at predetermined angles up and down. To this end, the rotary jig joint 250a may include a step motor, a worm gear, etc., or includes a linear solenoid, thereby being able to rotate up and down the hooked jig 230a. In some embodiments, other various structures that can rotate the hooked jig 230a can be applied.

A driving-malfunction vehicle 400 has the traction jig fastener 500a corresponding to the traction unit 200a of the OHT vehicle traction device 100. The traction jig fastener 500a includes a traction jig fastener ring 530a to which the hooked jig 230a can be fastened, and a fastener ring support member 510a.

Although the OHT vehicle traction device 100 has the traction unit 200a and the driving-malfunction vehicle 400 has the traction jig fastener 500a in FIG. 4B, the OHT vehicle traction device 100 may have a traction jig fastener and the driving-malfunction vehicle 400 may have a traction unit.

Further, the OHT vehicle traction device 100 includes the wireless power supply unit 130 and the malfunction vehicle control unit 150 and, in correspondence to this configuration, the driving-malfunction vehicle 400 include the wireless power input unit 430 and the wireless control communication module 450.

Figure 5:
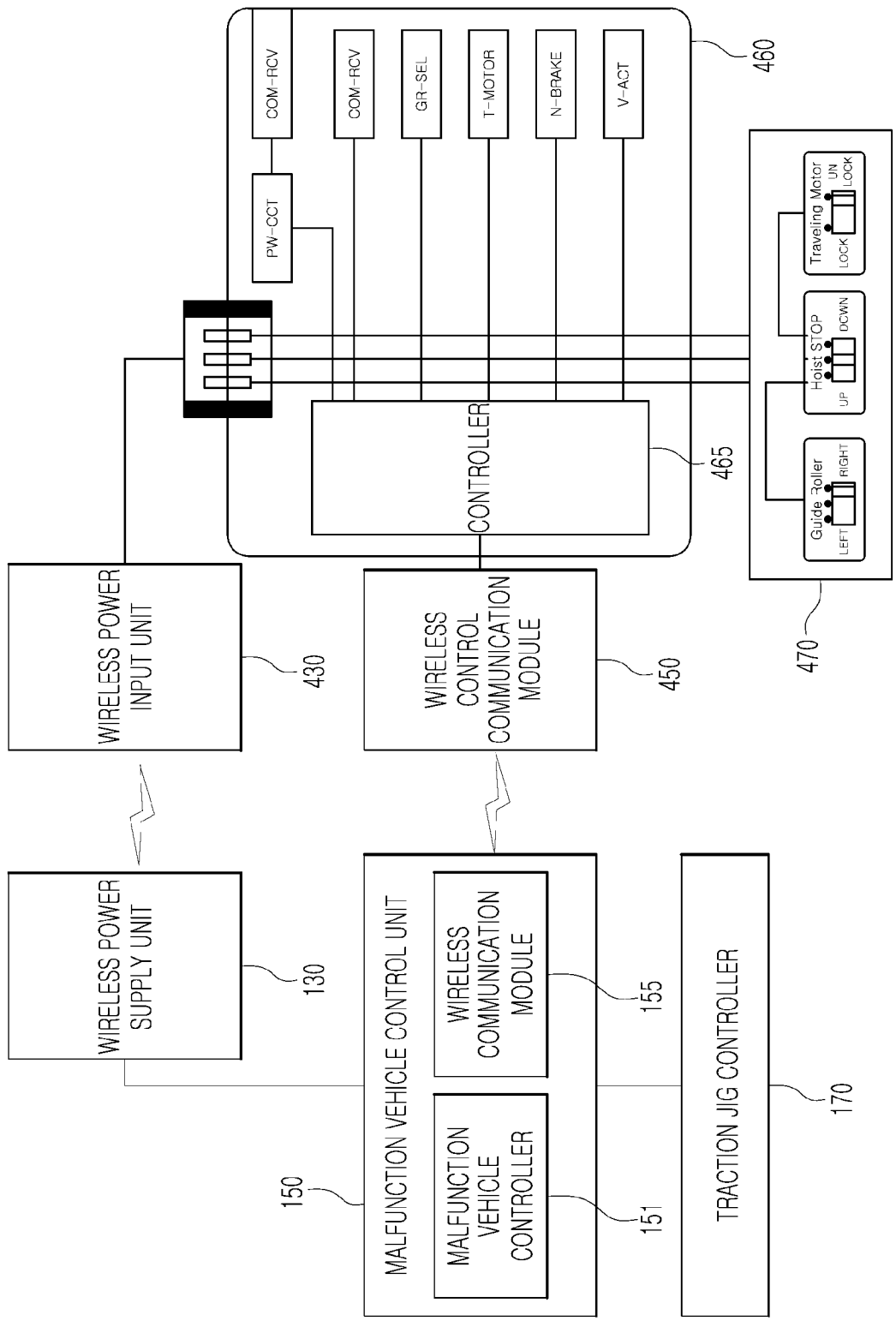
FIG. 5 shows an embodiment of a configuration for malfunction vehicle control and wireless power supply of the OHT vehicle traction device according to the present disclosure.

In relation to this, an embodiment of a configuration for malfunction vehicle control and wireless power supply of the OHT vehicle traction device according to the present disclosure is referred to in FIG. 5.

The wireless power supply unit 130 can wirelessly supply power to the wireless power input unit 430 of the driving-malfunction vehicle 400, and in this case, as described above, various wireless power transfer methods such as a magnetic induction type and a magnetic resonance type can be applied as the wireless power supply type.

The malfunction vehicle control unit 150 of the OHT vehicle traction device 100 may include a malfunction vehicle controller 151, a wireless communication module 155, etc.

The malfunction vehicle controller 151 can wirelessly supply power by controlling the wireless power supply unit 130 and can reset the driving-malfunction vehicle 400 or control the steering device when towing the driving-malfunction vehicle 400 through the wireless communication module 155. Various wireless communication methods such as Bluetooth®, WiFi®, Wibro™, ZigBee® can be applied to the wireless communication method.

The OHT vehicle traction device 100 may include a traction jig controller 170 that controls coupling or uncoupling of the traction jig between the traction unit and the traction jig fastener.

For example, when an OHT vehicle traction device 100 has a traction unit 200a and a driving-malfunction vehicle 400 has a traction jig fastener 500a, the traction jig controller 170 operates the traction unit 200a of the OHT vehicle traction device to be coupled or uncoupled to or from the traction jig fastener of the driving-malfunction vehicle 400. In some embodiments, when an OHT vehicle traction device has a traction jig fastener and a driving-malfunction vehicle has a traction unit, the traction jig controller 170 operates the traction unit of the driving-malfunction vehicle to be coupled or uncoupled to or from the traction jig fastener of the OHT vehicle traction device.

The traction jig controller 170 can be controlled by the malfunction vehicle control unit 150.

The driving-malfunction vehicle 400 fundamentally includes a driving control unit for controlling the moving unit, the steering device, the brake, etc., and this function can be controlled by a controller 465. A terminal unit 470 is provided for a manager to manually operate the driving control unit 460.

In the present disclosure, the driving-malfunction vehicle 400 may further include the wireless power input unit 430 and the wireless control communication module 450 for receiving wireless power and control signals from the OHT vehicle traction device 100.

The operational relationships of the components of the OHT vehicle traction device 100 and the components of the driving-malfunction vehicle 400 will be described in detail below through embodiments.

Figure 6A:
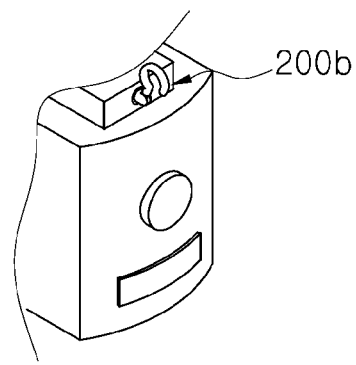
FIGS. 6A to 6C show the operation process of the traction unit of the OHT vehicle traction device according to the present disclosure.
Figure 6B:
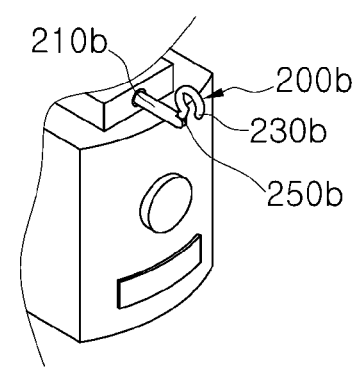
Figure 6C:
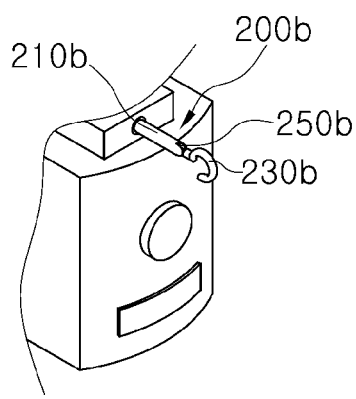

The traction support member of the traction unit may be configured to be inserted inside and pulled outside, if necessary, and in relation to this configuration, FIGS. 6A to 6C show the operation process of the traction unit of the OHT vehicle traction device according to the present disclosure.

The traction unit 200b of the OHT vehicle traction device 100 may include a traction support member room for storing the traction support member therein. As shown in FIG. 6A, the traction support member 210b is normally inserted in the traction support member room (not shown). When it is required to tow a driving-malfunction vehicle, as shown in FIG. 6B, the traction support member 210b is pulled outside toward the front of a driving-malfunction vehicle from the traction support member room (not shown).

The hooked jig 230b is applied in FIGS. 6A to 6C. As shown in FIG. 6C, the traction support member 210b is pulled out of the traction support member room and then the rotary jig joint 250b rotates the hooked jig 230b.

Inserting and pulling out the traction support member 210b and rotating the hooked jig 230b by the rotary jig joint 250b can be controlled by the jig controller of the traction unit.

As described above, since the OHT vehicle traction device has the traction support member room, the traction support member is normally inserted and kept in the traction support member room, so it is possible to prevent the traction unit from being damaged or being interfered with by another object.

Figure 7A:
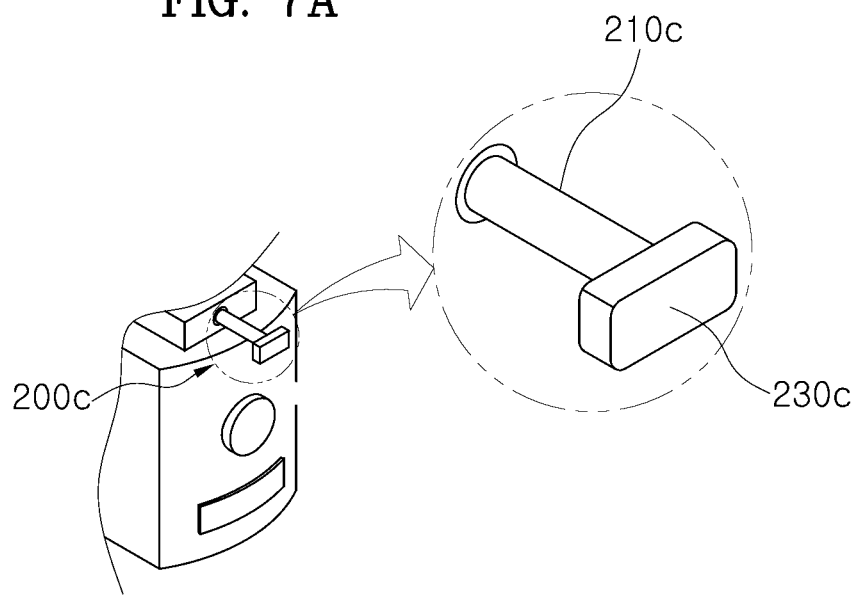
FIGS. 7A and 7B show an embodiment of the traction unit of the OHT vehicle traction device according to the present disclosure.
Figure 7B:
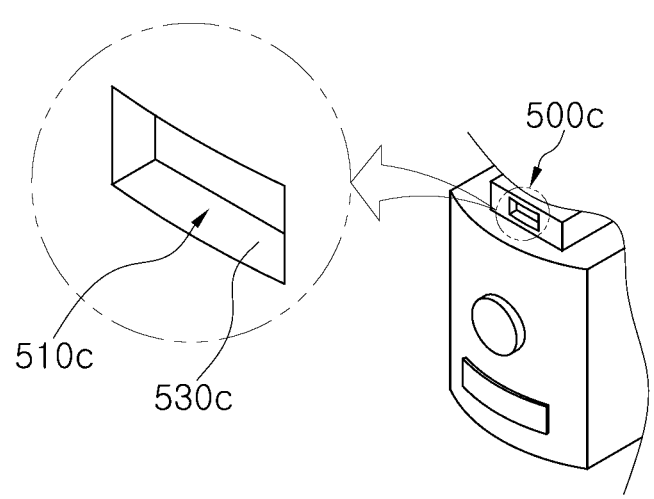

FIGS. 7A and 7B show an embodiment of the traction unit of the OHT vehicle traction device according to the present disclosure.

In an embodiment, a traction unit 200c having an electromagnetic jig and a traction jig fastener 500c corresponding to the traction unit 200c are proposed. As described above, when an OHT vehicle traction device approaches the front of a driving-malfunction vehicle and pulls the driving-malfunction vehicle, the traction unit 200c may be installed on the rear surface of the OHT vehicle traction device and the traction jig fastener 500c may be installed on the front surface of the driving-malfunction vehicle. Further, when an OHT vehicle traction device approaches the rear of a driving-malfunction vehicle and pushes the driving-malfunction vehicle, the traction unit 200c may be installed on the front surface of the OHT vehicle traction device and the traction jig fastener 500c may be installed on the rear surface of the driving-malfunction vehicle The traction unit 200c of the OHT vehicle traction device may include a traction support member 210c and an electromagnetic jig 230c that is a traction jig, etc.

The electromagnetic jig 230c generates magnetism when it is powered, and a traction jig controller controls power supply for the electromagnetic jig 230c, thereby being able to control coupling or uncoupling to or from the traction jig fastener 500c.

As shown in FIGS. 6A to 6C, the traction support member 210c is pulled out of the traction support member room (not shown), whereby the electromagnetic jig 230c can be fastened to the traction jig fastener 500c.

In relation to fastening the electromagnetic jig 230c, the traction jig fastener made of a metallic material may be formed as a flat surface on a driving-malfunction vehicle such that a portion thereof can be attached by the magnetism of the electromagnetic jig 230c. However, as shown in FIG. 6B, the traction jig fastener 500c having a space in which the electromagnetic jig 230c can be fastened may be provided.

The traction jig fastener 500c has a jig fastening space 510c that corresponds to the electromagnetic jig 230c and in which the electromagnetic jig 230c can be inserted. An electromagnetic fastening portion 530c made of metal is formed in the jig fastening space 510c so that the electromagnetic jig 230c is coupled by magnetism.

Since an electromagnetic jig is applied, the traction unit and the traction jig fastener can be formed in simple structures and the jig can be more accurately fastened.

Figure 8A:
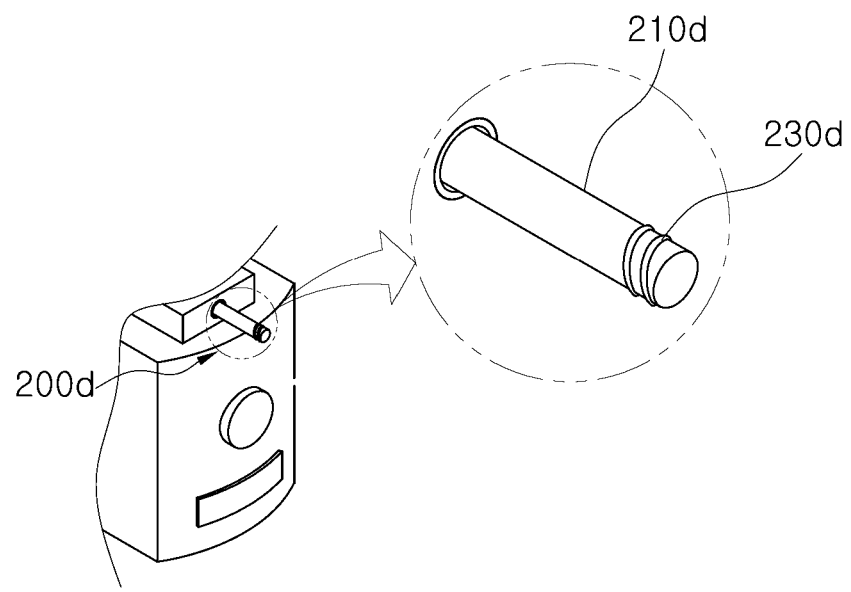
FIGS. 8A and 8B show an embodiment of the traction unit of the OHT vehicle traction device according to the present disclosure.
Figure 8B:
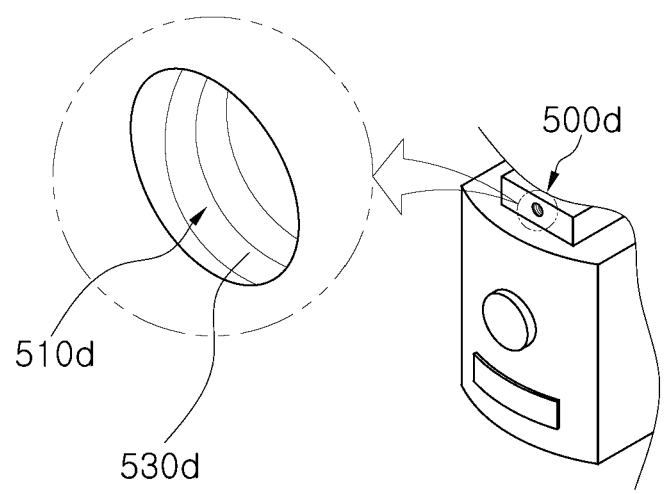

FIGS. 8A and 8B show an embodiment of the traction unit of the OHT vehicle traction device according to the present disclosure.

In an embodiment, a traction unit 200d having a threaded jig and a traction jig fastener 500d corresponding to the traction unit 200d are proposed.

The traction unit 200d of the OHT vehicle traction device may include a traction support member 210d and a threaded jig 230c that is a traction jig, etc. The threaded jig 230c may extend from an end of the traction support member 210d and may have threads on the outer surface.

The traction jig fastener 500d of the driving-malfunction vehicle has a jig fastening space 510d that corresponds to the shape of the threaded jig 230d and in which the threaded jig 230d can be inserted. A threaded jig fastening portion 530d having threads formed on the inner surface to correspond to the threads of the threaded jig 230d is formed in the jig fastening space 510d.

The traction jig controller pulls out the traction support member 210d of the traction unit 200d from the traction support member room (not shown) and rotates the threaded jig 230d while inserting the traction support member 210d into the jig fastening space 510d of the traction jig fastener 500d, whereby the threaded jig 230d can be fastened to the threaded jig fastening portion 530d.

Since a threaded jig is applied, as described above, it is possible to keep the jig stably fastened even if various types of shock are generated when the OHT vehicle traction device tows a driving-malfunction vehicle.

Figure 9A:
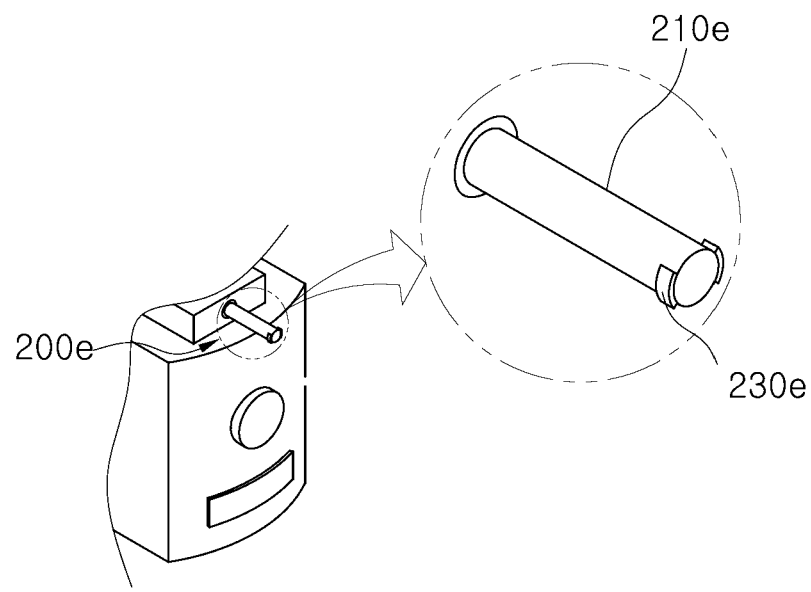
FIGS. 9A and 9B show an embodiment of the traction unit of the OHT vehicle traction device according to the present disclosure.
Figure 9B:
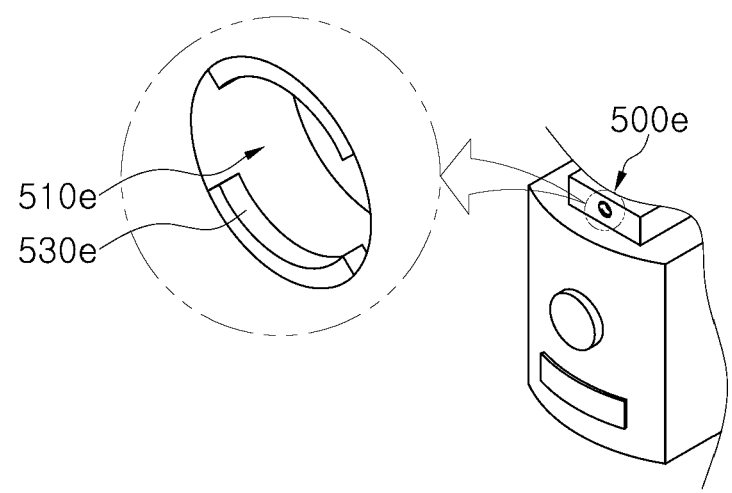

FIGS. 9A and 9B show an embodiment of a traction unit of the OHT vehicle traction device according to the present disclosure.

In an embodiment, a traction unit 200e having a protruding jig and a traction jig fastener 500e corresponding to the traction unit 200e are proposed.

The traction unit 200e of the OHT vehicle traction device may include a traction support member 210e and a protruding jig 230e that is a traction jig, etc. The protruding jig 230e may extend from an end of the traction support member 210e and radially protrude from the outer surface of the traction support member 210e, but the number of the protruding jig 230e may be changed, if necessary.

The traction jig fastener 500e of the driving-malfunction vehicle has a jig fastening space 510e that corresponds to the shape of the protruding jig 230e and in which the protruding jig 230e can be inserted. A protruding-jig fastening portion 530e is formed in the jig fastening space 510e so that the protruding jig 230d can be fastened and locked therein.

In order to fasten the protruding jig, the traction jig controller pulls out the traction support member 210e of the traction unit 200e from the traction support member room (not shown), inserts the traction support member 210e into the jig fastening space 510e of the traction jig fastener 500e, and rotates the protruding jig 230e at a predetermined angle, whereby the protruding jig 230e can be fastened to the protruding jig fastening portion 530e.

As described above, since a protruding jig is applied, it is possible to simply fasten the traction unit of the OHT vehicle traction device and the traction jig fastening unit of the driving-malfunction vehicle and to keep same stably fastened.

Figure 10A:
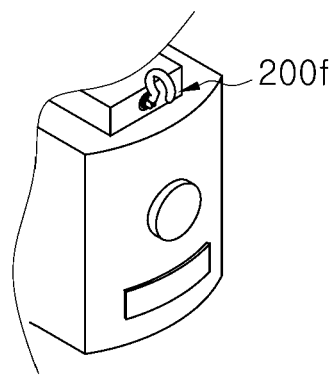
FIGS. 10A to 10C show an embodiment of the traction unit of the OHT vehicle traction device according to the present disclosure.
Figure 10B:
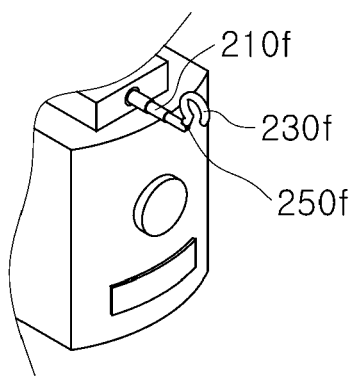
Figure 10C:
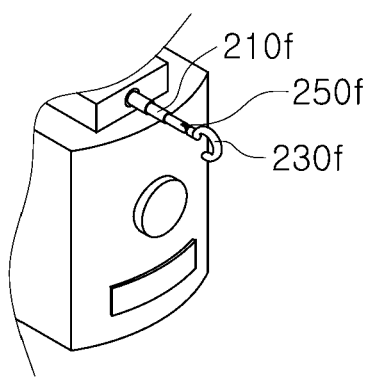

FIGS. 10A to 10C show an embodiment of the traction unit of the OHT vehicle traction device according to the present disclosure.

As shown in FIG. 10A, a traction support member room (not shown) for keeping the traction support member of a traction unit 200f may be formed, but it may be difficult to secure a space having a sufficient depth for the traction support member room due to a structural reason.

Accordingly, in an embodiment, as shown in FIG. 10B, the traction support member 210f is composed of a plurality of telescopic-type pipes that are pulled out or inserted in multiple stages. When the traction support member 201 is kept in the traction support member room, it is kept in the traction support member room by inserting the plurality of pipes in multiple stages, so the depth of the space can be reduced.

Further, in an embodiment, a hooked jig 230f is applied and is rotated by a rotary jig joint 250b to be fastened, as shown in FIG. 10C, which is only an example and various types of jigs described above may be applied.

Further, the present disclosure proposes a configuration that can absorb various types of shock that are generated when a jig is fastened to two a driving-malfunction vehicle or a driving-malfunction vehicle is towed, and a configuration that stably tows a driving-malfunction vehicle at bends of a rail, etc. In relation to this, FIGS. 11A and 11B show an embodiment of a shock-absorbing member and a joint for a traction unit of the OHT vehicle traction device according to the present disclosure.

Figure 11A:
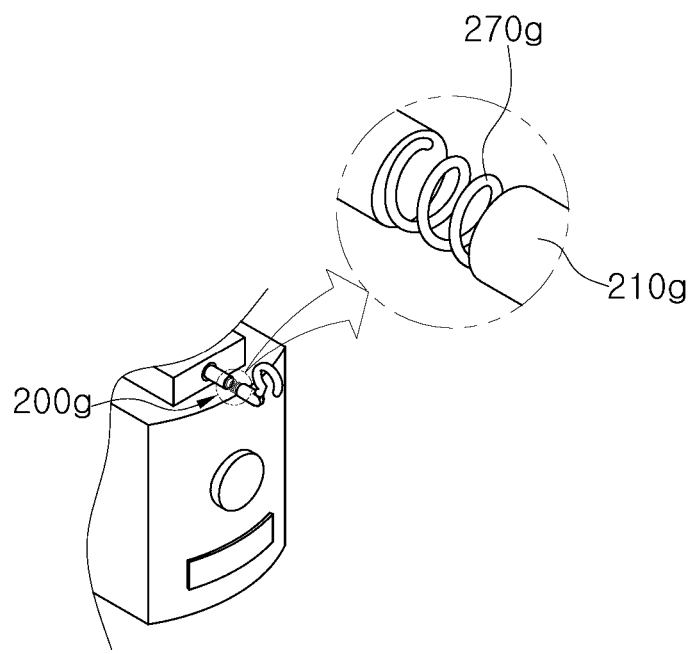
FIGS. 11A and 11B show an embodiment of a shock-absorber member and a joint of the traction unit of the OHT vehicle traction device according to the present disclosure.
Figure 11B:
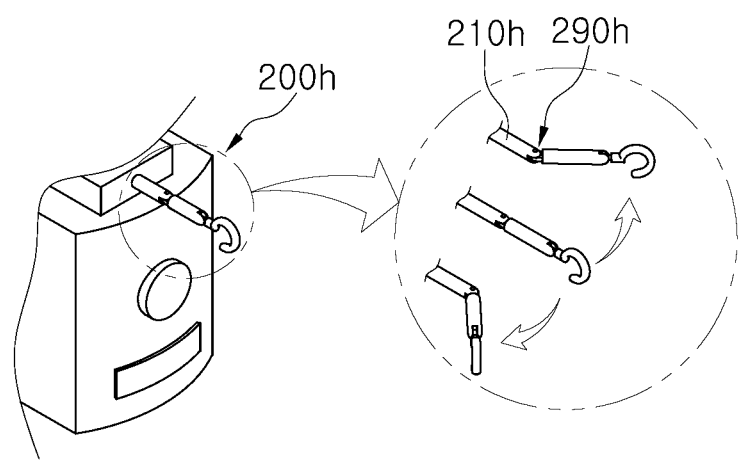

FIG. 11A is an embodiment of a shock-absorbing member. A traction support member 210g of a traction unit 200g may have a shock-absorbing member 270g having a spring structure. The shock-absorbing member 270g is not limited to the spring structure and various elastic members that can absorb shock may be applied.

The shock-absorbing member 270g is disposed at the middle portion of the traction support member 201g. However, if necessary, the shock-absorbing member 270g may be disposed at appropriate positions such as an end of the traction support member 201g and the number and kind of the shock-absorbing member 270g may be variously changed.

Since the shock-absorbing member is applied, it is possible to more stably fasten the jig and more stably tow a driving-malfunction vehicle by absorbing shock that is generated when the jig is fastened or shock that is generated when a driving-malfunction vehicle is towed.

FIG. 11B is an embodiment of a joint. A joint 290h is formed at the middle portion of a traction support member 210h of a traction unit 200h, so the traction support member 210h can be partially rotated left and right with respect to the joint 290h.

The joint 290h may be provided to divide the traction support member 210h into two parts and the two parts may be thread-fastened such that left-right rotation is possible, or a flexible member may be inserted between the two parts such that left-right rotation is possible. If necessary, several joints 290h may be formed at the traction support member 210h.

Since the joint is applied, when a driving-malfunction vehicle is towed, the joint is rotated left and right at a bend, so the driving-malfunction vehicle can be stably towed.

The OHT vehicle traction device has a traction unit and a driving-malfunction vehicle has a traction jig fastener in the embodiments shown in FIGS. 3 to 11B, but, if necessary, the OHT vehicle traction device may have a traction jig fastener and the driving-malfunction vehicle may have a traction unit, which may be selectively changed.

When a driving-malfunction vehicle has a traction unit, the OHT vehicle traction device can control the traction unit of the driving-malfunction vehicle to be fastened to and unfastened from the traction jig fastener through the traction jig controller while wirelessly supplying power to the driving-malfunction vehicle.

Figure 12:
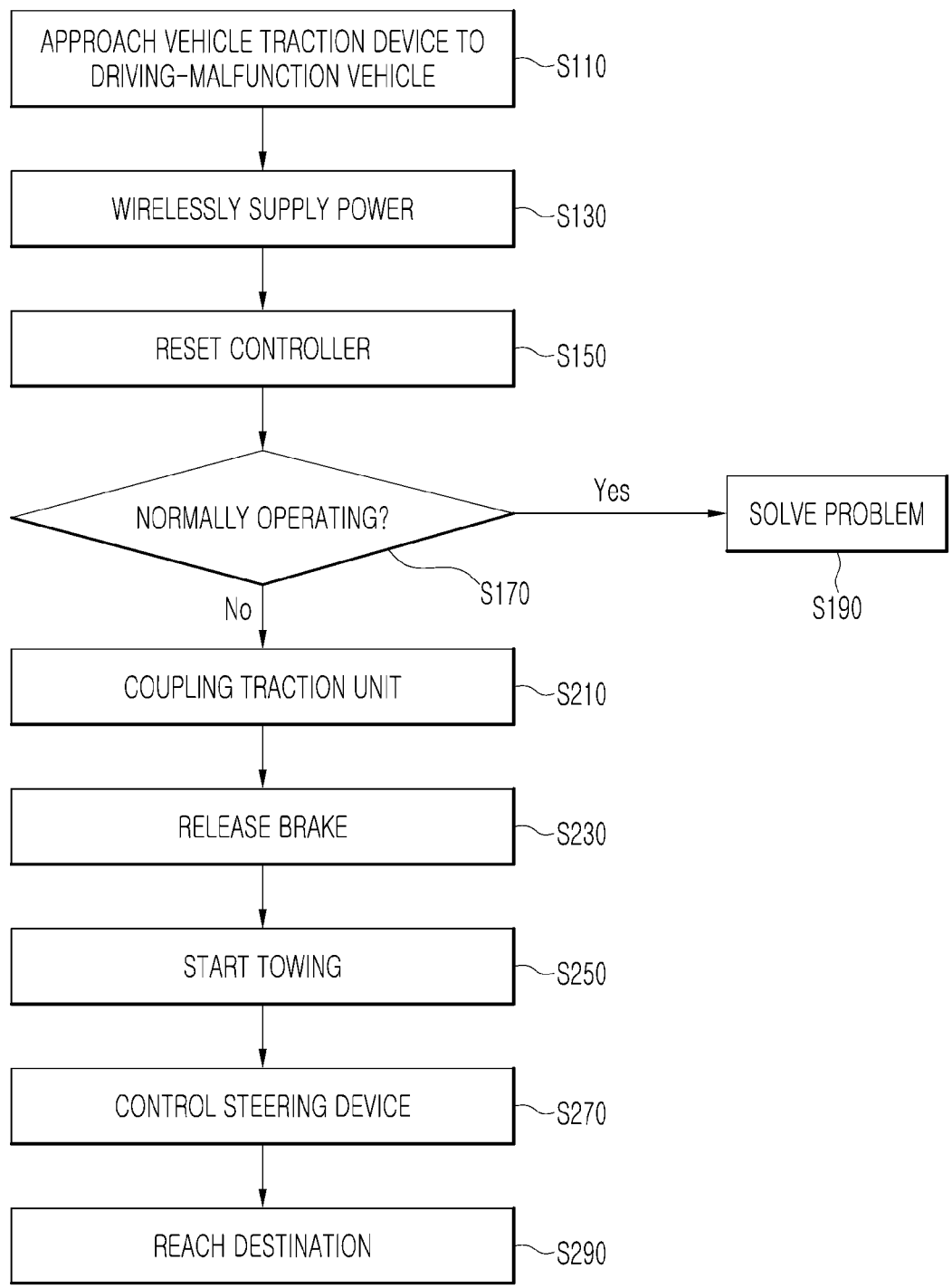
FIG. 12 is a flowchart illustrating an embodiment of a method of managing an OHT system according to the present disclosure.

The present disclosure provides a method that can more efficiently operate an OHT system by applying the OHT vehicle traction device described above. FIG. 12 shows a flowchart of an embodiment of a method of managing an OHT system according to the present disclosure.

When an OHT vehicle is stopped on a rail of an OHT system due to a driving-malfunction, an OHT vehicle traction device approaches the driving-malfunction vehicle (S110). In this case, the OHT vehicle traction device has a sensor for sensing an OHT vehicle, so the OHT vehicle traction device can approach close to the driving-malfunction vehicle up to a predetermined distance.

After approaching as close as possible such that wireless power supply is possible, the OHT vehicle traction device wirelessly supplies power to the wireless power input unit of the driving-malfunction vehicle through the wireless power supply unit thereof (S130) and wirelessly resets the controller of the driving-malfunction unit (S150).

As for the wireless rest, as described above with reference to FIG. 5, the malfunction vehicle control unit 150 controls the wireless power supply unit 130, whereby power is wirelessly supplied to the wireless power input unit 430 of the driving-malfunction vehicle and the controller 465 is reset through the wireless control communication module 450 of the driving-malfunction vehicle.

After resetting the driving-malfunction vehicle, the OHT vehicle traction device checks whether the driving-malfunction vehicle can be normally operated (S170). The malfunction vehicle control unit 150 checks the operation state of the controller 465 through the wireless control communication module 450 of the driving-malfunction vehicle, whereby it is possible to check whether the driving-malfunction vehicle can be normally operated.

When the driving-malfunction vehicle can be normally operated through resetting, the driving malfunction of the driving-malfunction vehicle can be solved (S190), but when the driving-malfunction vehicle cannot be normally operated even after resetting, it should be towed to a repair place.

In this case, the OHT vehicle traction device fastens the traction jig of the traction unit to the traction jig fastener (S210) and then releases the brake by controlling the controller 465 through the wireless control communication module 450 of the driving-malfunction vehicle while wirelessly supplying power to the driving-malfunction vehicle (S230).

When the brake is released and the driving-malfunction vehicle can be towed, the OHT vehicle traction device starts to tow the driving-malfunction vehicle to a destination (S250).

During towing, there may be several bottlenecks or bends in the route from the location where the driving-malfunction vehicle is stopped to the destination, and there may be a congestion section or stop section due to forward OHT vehicles.

In order to appropriately deal with various problems that are generated during towing, the malfunction vehicle control unit 150 of the OHT vehicle traction device controls the controller 465 through the wireless control communication module 450 of the driving-malfunction vehicle. In particular, it is possible to secure smooth towing at a bend, etc. by controlling the steering device of the driving-malfunction vehicle (S270).

When towing the driving-malfunction vehicle to the destination (S290), the OHT vehicle traction device unfastens the traction jig of the traction unit and finishes towing the driving-malfunction vehicle.

The operation process of various OHT vehicle traction devices according to the present disclosure described above in the method of managing an OHT system according to the present disclosure is described in more detail through embodiments.

FIGS. 13A to 13D show a first operation embodiment of the method of managing an OHT system according to the present disclosure.

The first operation embodiment shows the operation process in the method of managing an OHT system that employs an embodiment of an OHT vehicle traction device described with reference to FIGS. 4A and 4B.

Figure 13A:
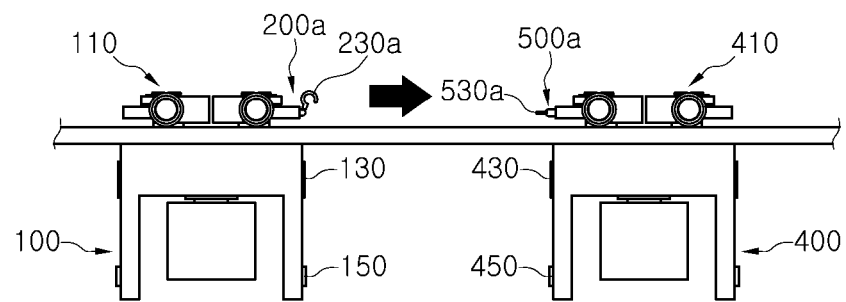
FIGS. 13A to 13D show a first operation embodiment of the method of managing an OHT system according to the present disclosure.
Figure 13B:
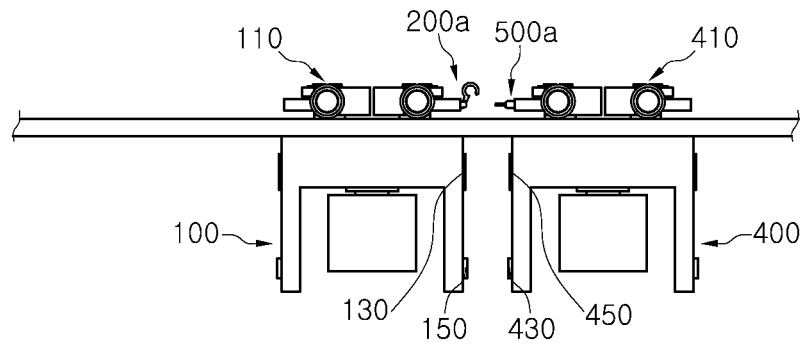

First, when a driving-malfunction vehicle 400 stops while driving on a rail, as shown in FIG. 13A, the OHT vehicle traction device 100 approaches the front of the driving-malfunction vehicle 400 through the moving unit 110. In this case, a sensor (not shown) that senses a rearward OHT vehicle is disposed on the rear surface of the OHT vehicle traction device 100, so the OHT vehicle traction device 100 approaches the front of the driving-malfunction vehicle 400 up to a predetermined approach distance while checking the approach distance through the sensor.

When approaching the front of the driving-malfunction vehicle 400 up to a predetermined approach distance, the OHT vehicle traction device 100 wirelessly supplies power to the wireless power input unit 430 of the driving-malfunction vehicle 400 through the wireless power supply unit 130 to reset the driving-malfunction vehicle 400.

After the OHT vehicle traction device 100 resets the driving-malfunction vehicle 400 by wirelessly supplying power to the driving-malfunction vehicle 400, when the driving-malfunction vehicle 400 is normally operated, the OHT vehicle traction device 100 is moved for other work.

Figure 13C:
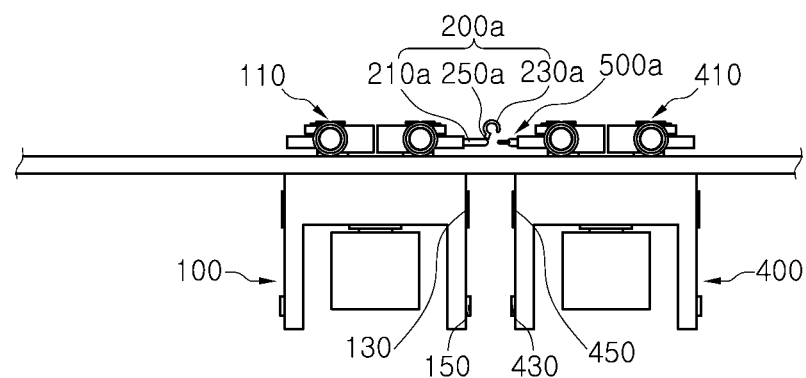

If the driving-malfunction vehicle 400 is not normally operated even after resetting, the OHT vehicle traction device 100 fastens the traction jig fastener 500a and the traction jig to each other by operating the traction unit 200a. To this end, as shown in FIG. 13C, the traction jig controller pulls out the traction support member 210a from the traction jig member room (not shown).

Figure 13D:
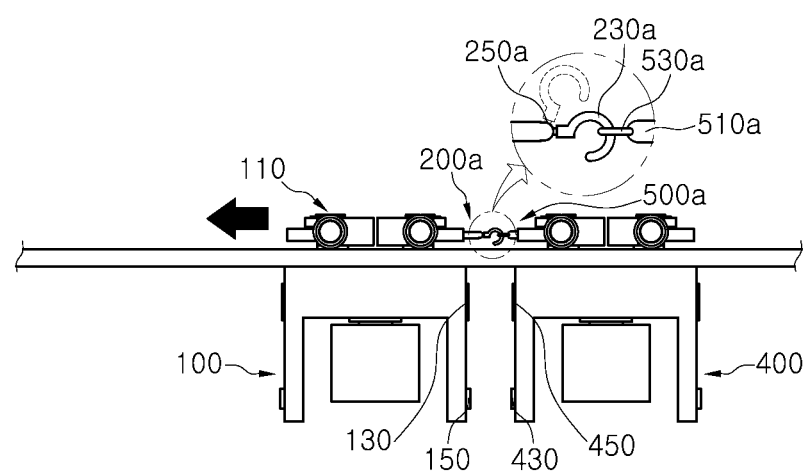

Further, as shown in FIG. 13D, the traction jig controller rotates the rotary jig joint 250a, whereby the hooked jig 230a is hooked to the traction jig fastening ring 530a of the traction jig fastener 500a.

When the traction unit 200a and the traction jig fastener 500a are fastened to each other, the OHT vehicle traction device 100 starts to tow the driving-malfunction vehicle 400.

Figure 14:
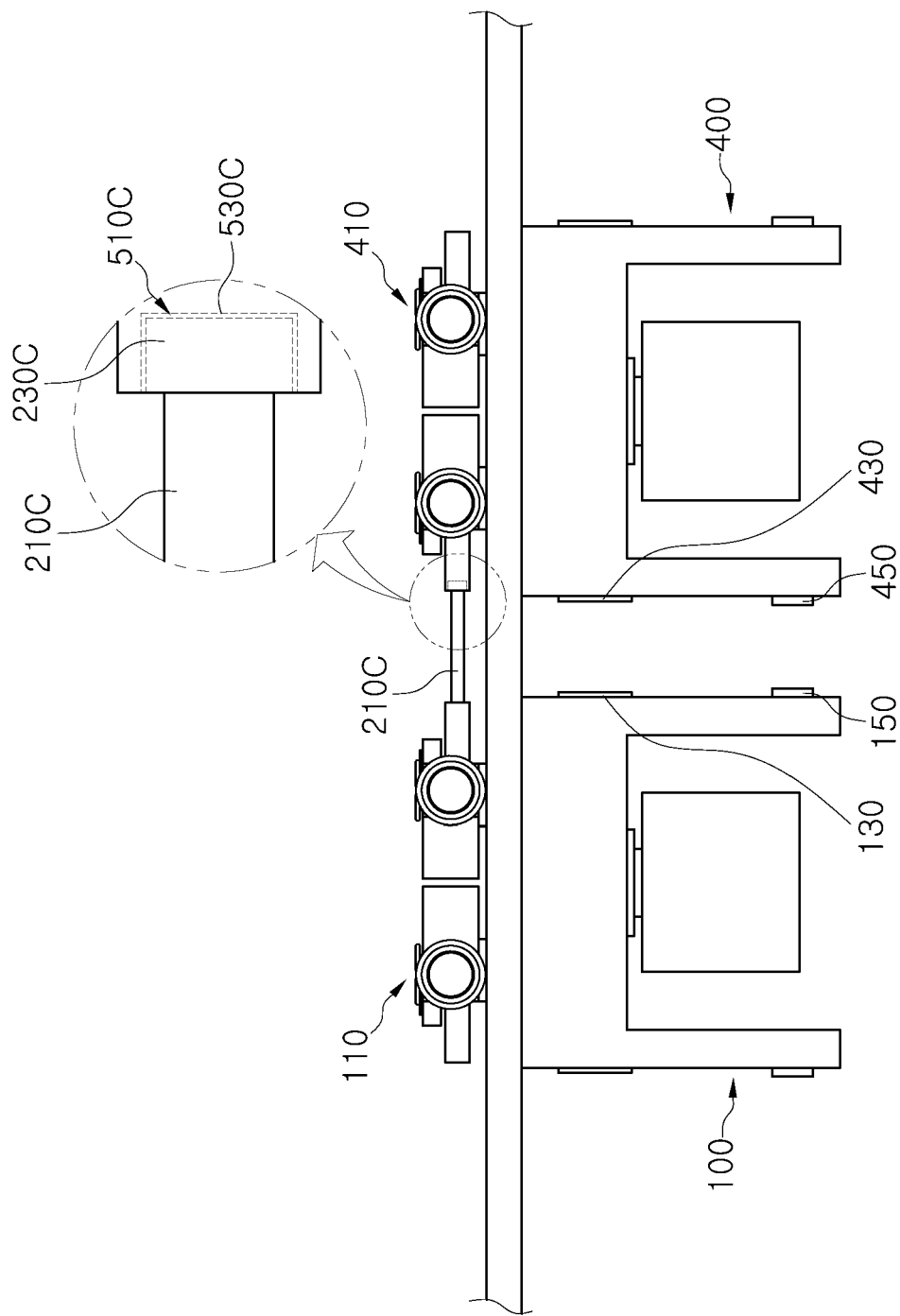
FIG. 14 shows a second operation embodiment of the method of managing an OHT system according to the present disclosure.

FIG. 14 shows a second operation embodiment of the method of managing an OHT system according to the present disclosure.

The second operation example is the operation process of a method of managing an OHT system that employs an embodiment of an OHT vehicle traction device described with reference to FIGS. 7A and 7B, but the process in which the OHT vehicle traction device 100 approaches the front of a driving-malfunction vehicle 400 and resets the driving-malfunction vehicle 400 while wirelessly supplying power is the same as that described with reference to FIGS. 13A to 13D, so it is not described in this case.

When the driving-malfunction vehicle 400 is not normally operated even after resetting, the traction unit and the traction jig fastener are fastened to each other to tow the driving-malfunction vehicle 400, and FIG. 14 shows the case employing the electromagnetic jig shown in FIGS. 7A and 7B.

The traction jig controller of the OHT vehicle traction device 100 pulls out the traction support member 210c toward the driving-malfunction vehicle 400 from the traction support member room (not shown). As the traction support member 210c is pulled out, the electromagnetic jig 230c at the end of the traction support member 210c is inserted into the jig fastening space 510c formed at the traction jig fastener of the driving-malfunction vehicle 400.

When the electromagnetic jig 230c is inserted in the jig fastening space 510c, the jig controller supplies power to the electromagnetic jig 230c, whereby the electromagnetic jig 230c generates magnetism. Accordingly, the electromagnetic jig 230c is fastened to the electromagnetic jig fastening portion 530c of the traction jig fastener.

When the electromagnetic jig 230c is coupled to the electromagnetic jig fastening portion 530c by magnetism, the OHT vehicle traction device 100 starts to tow the driving-malfunction vehicle 400.

Figure 15:
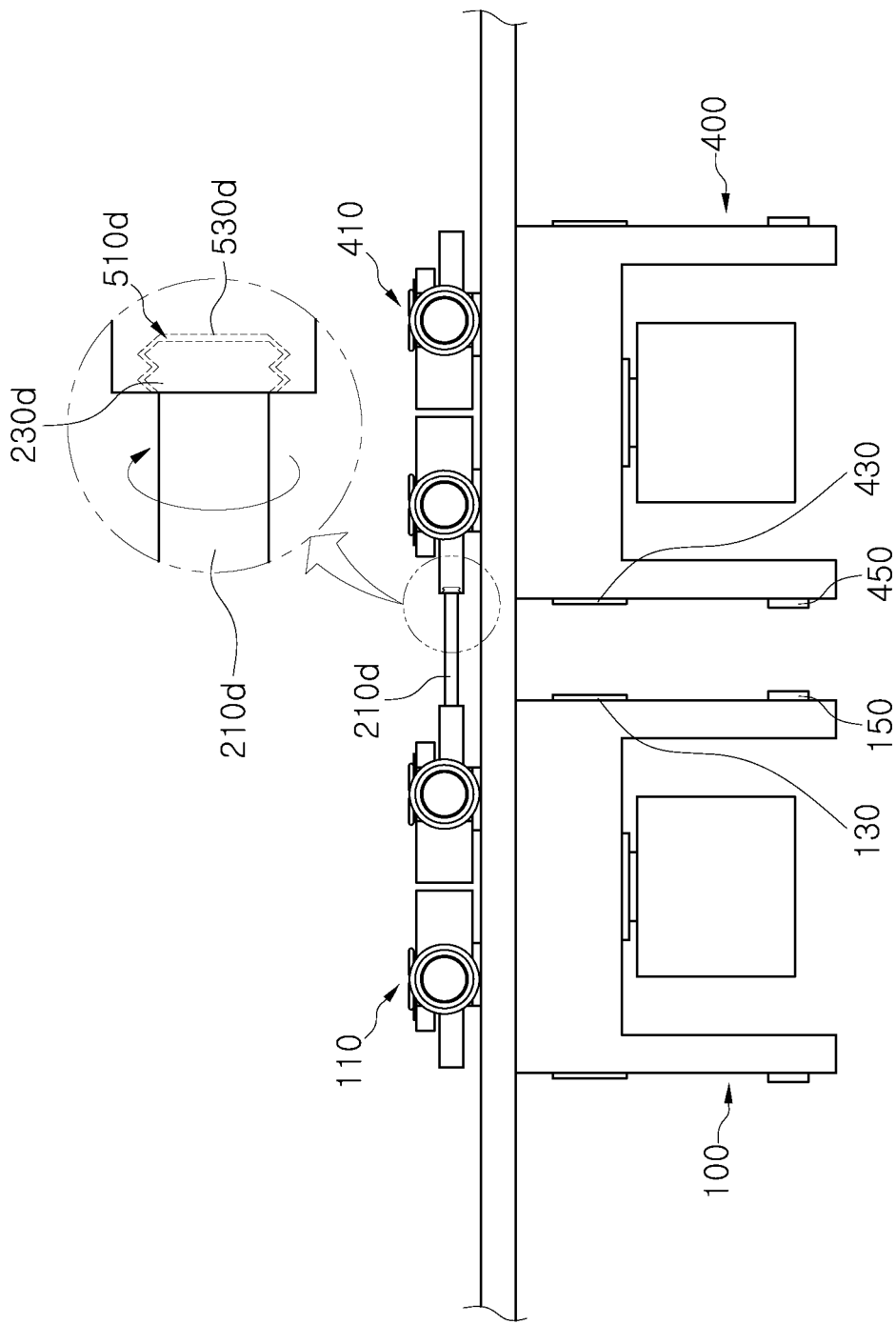
FIG. 15 shows a third operation embodiment of the method of managing an OHT system according to the present disclosure.

FIG. 15 shows a third operation embodiment of the method of managing an OHT system according to the present disclosure.

The third operation example is the operation process of a method of managing an OHT system that employs an embodiment of an OHT vehicle traction device described with reference to FIGS. 8A and 8B, but the process in which the OHT vehicle traction device 100 approaches the front of a driving-malfunction vehicle 400 and resets the driving-malfunction vehicle 400 while wirelessly supplying power is the same as that described with reference to FIGS. 13A to 13D, so it is not described in this case.

When the driving-malfunction vehicle 400 is not normally operated even after resetting, the traction unit and the traction jig fastener are fastened to each other to tow the driving-malfunction vehicle 400, and FIG. 15 shows the case employing the threaded jig shown in FIGS. 8A and 8B.

The traction jig controller of the OHT vehicle traction device 100 pulls out the traction support member 210d toward the driving-malfunction vehicle 400 from the traction support member room (not shown). As the traction support member 210d is pulled out, the threaded jig 230d at the end of the traction support member 210d is inserted into the jig fastening space 510d formed at the traction jig fastener of the driving-malfunction vehicle 400.

The traction jig controller pulls out the traction support member 210d and simultaneously rotates the threaded jig 230d so that the threads of the threaded jig 230d can be fitted to the threads formed on the inner surface of the jig fastening space 510d.

As the threaded jig 230d is inserted into the jig fastening space 510d while rotating, the threaded jig 230d is fastened to the traction jig fastener.

When threaded jig 230d of the traction unit is fastened to the traction jig fastener, the OHT vehicle traction device 100 starts to tow the driving-malfunction vehicle 400.

Figure 16:
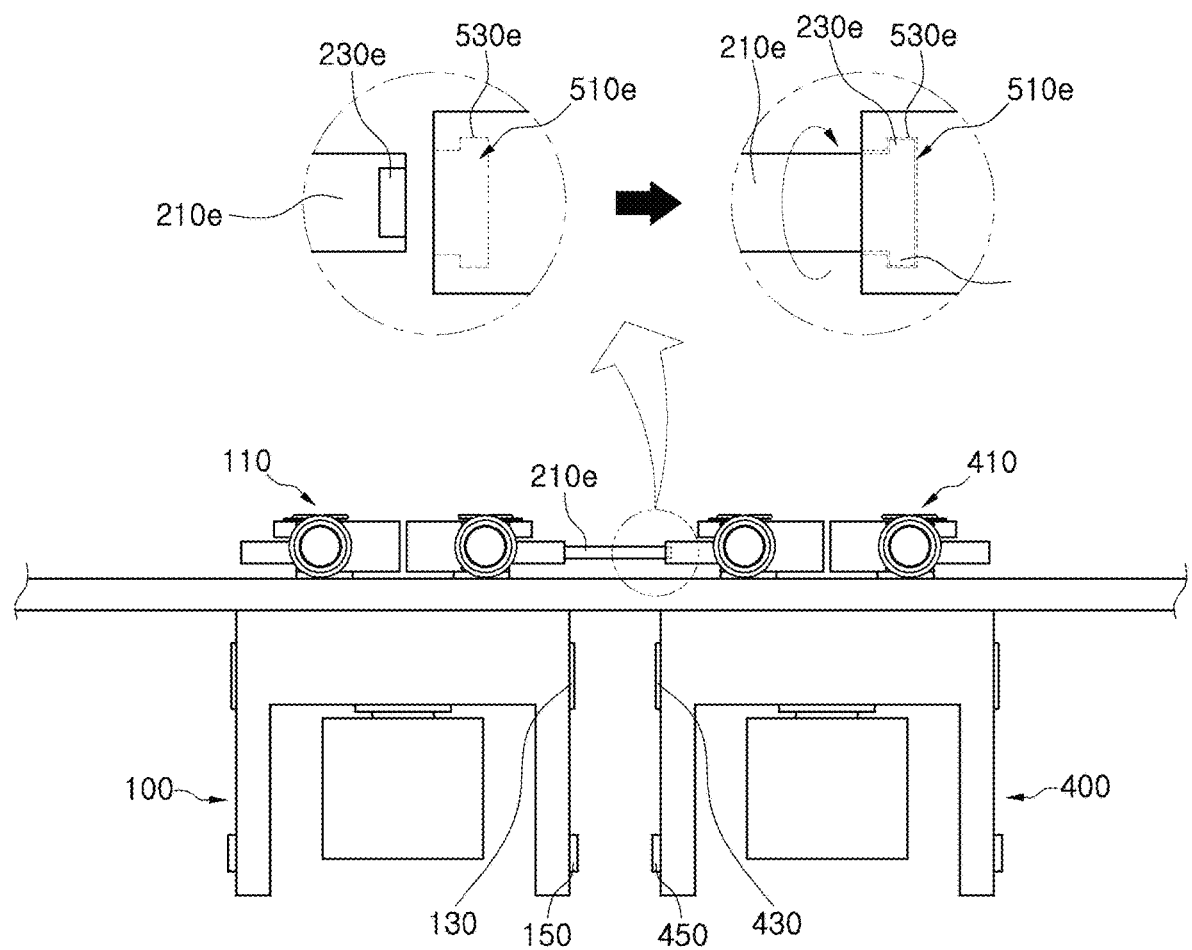
FIG. 16 shows a fourth operation embodiment of the method of managing an OHT system according to the present disclosure.

FIG. 16 shows a fourth operation embodiment of the method of managing an OHT system according to the present disclosure.

The fourth operation example is the operation process of a method of managing an OHT system that employs an embodiment of an OHT vehicle traction device described with reference to FIGS. 9A and 9B, but, as described above, the process in which the OHT vehicle traction device 100 approaches the front of a driving-malfunction vehicle 400 and resets the driving-malfunction vehicle 400 while wirelessly supplying power is the same as that described with reference to FIGS. 13A to 13D, so it is not described in this case.

When the driving-malfunction vehicle 400 is not normally operated even after resetting, the traction unit and the traction jig fastener are fastened to each other to tow the driving-malfunction vehicle 400, and FIG. 16 shows the case employing the protruding jig shown in FIGS. 9A and 9B.

The traction jig controller of the OHT vehicle traction device 100 pulls out the traction support member 210e toward the driving-malfunction vehicle 400 from the traction support member room (not shown), whereby the protruding jig 230e at the end of the traction support member 201e is inserted into the jig fastening space 510e formed at the traction jig fastener of the driving-malfunction vehicle 400.

In this case, as shown in FIG. 16, the protruding jig 230e is inserted into the jig fastening space 510e such that the protrusion of the protruding jig 230e does not overlap the protruding jig fastening portion 530e formed in the jig fastening space 510e.

After the protruding jig 230e is inserted in the jig fastening space 510e, the jig controller rotates the protruding jig 230e at a predetermined angle such that the protruding jig 230e is locked to the protruding jig fastening portion 530e.

When the protruding jig 230e is engaged with the protruding jig fastening portion 530e of the jig fastening space 510e, the OHT vehicle traction device 100 starts to tow the driving-malfunction vehicle 400.

FIGS. 13A to 16 show an example in which the OHT vehicle traction device 100 approaches the front of the driving-malfunction vehicle 400, fastens the traction unit thereof to the traction jig fastener of the driving-malfunction vehicle 400, and then pulls the driving-malfunction vehicle 400 ahead of the driving-malfunction vehicle 400, but this configuration may be changed in various ways.

For example, an OHT vehicle traction device may have a traction jig fastener and a driving-malfunction vehicle may have a traction unit. In this case, the OHT vehicle traction device may approach the rear of the driving-malfunction vehicle, fasten the traction unit and the traction jig fastener to each other, and then push the driving-malfunction vehicle.

As one embodiment of these various modified configurations, FIGS. 17A to 17D show a fifth operation embodiment of the method of managing an OHT system according to the present disclosure.

The fifth operation example shows a process in which the OHT vehicle traction device 100 has a traction jig fastener 800, the driving-malfunction vehicle 400 has a traction unit 700, and the OHT vehicle traction device 100 pushes the driving-malfunction vehicle 400 from behind.

Figure 17A:
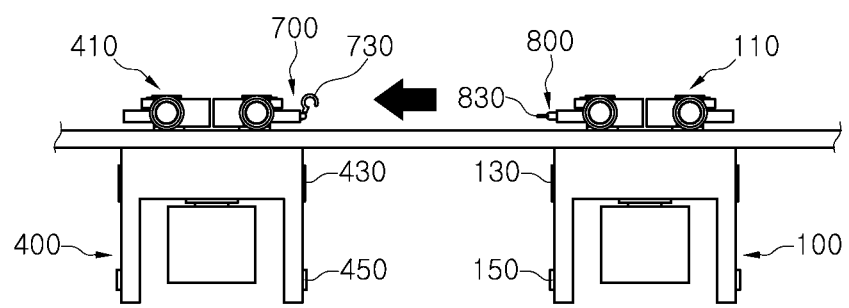
FIGS. 17A to 17D show a fifth operation embodiment of the method of managing an OHT system according to the present disclosure.

First, as shown in FIG. 17A, when a driving-malfunction vehicle 400 stops while driving on a rail, the OHT vehicle traction device 100 approaches the rear of the driving-malfunction vehicle 400 through the moving unit 110. In this case, a sensor (not shown) that senses a forward OHT vehicle is disposed on the front surface of the OHT vehicle traction device 100, so the OHT vehicle traction device 100 approaches the rear of the driving-malfunction vehicle 400 up to a predetermined approach distance while checking the approach distance through the sensor.

Figure 17B:
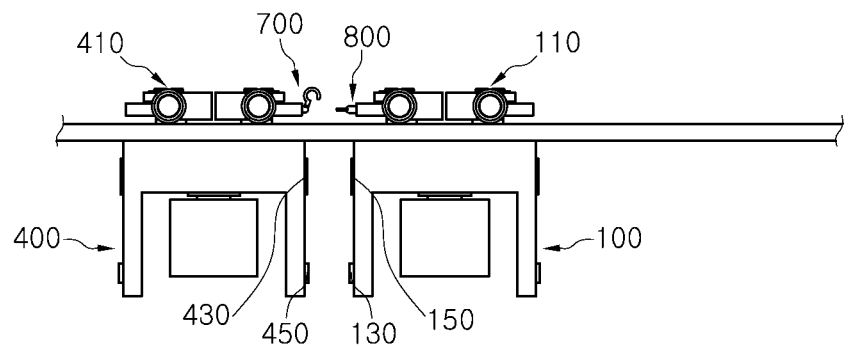

As shown in FIG. 17B, when approaching the rear of the driving-malfunction vehicle 400 up to a predetermined approach distance, the OHT vehicle traction device 100 wirelessly supplies power to the wireless power input unit 430 of the driving-malfunction vehicle 400 through the wireless power supply unit 130 to reset the driving-malfunction vehicle 400.

After the OHT vehicle traction device 100 resets the driving-malfunction vehicle 400 by wirelessly supplying power to the driving-malfunction vehicle 400, when the driving-malfunction vehicle 400 is normally operated, the OHT vehicle traction device 100 is moved for other work.

Figure 17C:
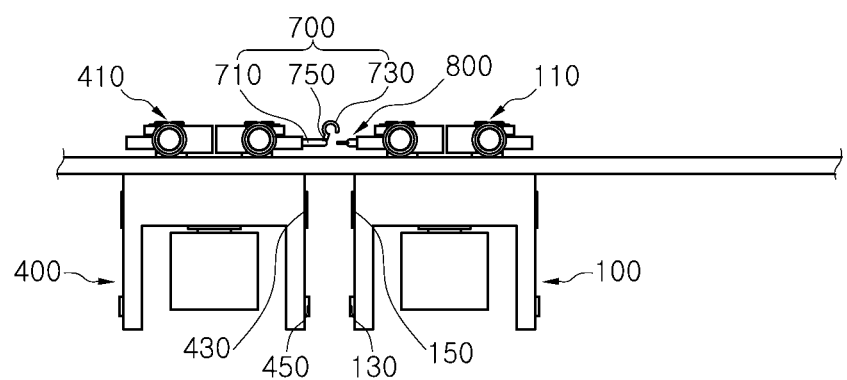

When the driving-malfunction vehicle 400 is not normally operated even after resetting, the OHT vehicle traction device 100 operates the traction unit 700 of the driving-malfunction vehicle 400 to be fastened to the traction jig fastener 800. To this end, as shown in FIG. 17C, the traction jig controller of the OHT vehicle traction device 100 controls the driving-malfunction vehicle 400 through wireless communication, whereby the traction support member 710 is pulled out of the traction support member room (not shown) of the driving-malfunction vehicle 400.

Figure 17D:
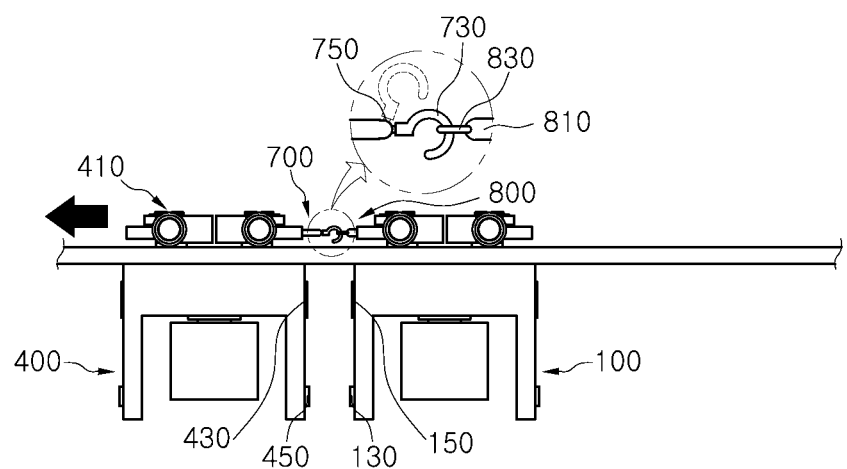

Further, as shown in FIG. 17D, the traction jig controller rotates the rotary jig joint 750, whereby the hooked jig 730 is hooked to the traction jig fastening ring 830 of the traction jig fastener 800.

When the traction unit 700 and the traction jig fastener 800 are fastened to each other, the OHT vehicle traction device 100 starts to tow the driving-malfunction vehicle 400.

Although FIGS. 17A to 17D show an example employing a hooked jig, traction units having various types of jigs described with reference to FIGS. 14 to 16 may be provided at a driving-malfunction vehicle, and traction jig fasteners corresponding to the traction units may be provided at an OHT vehicle traction device.

Figure 18:
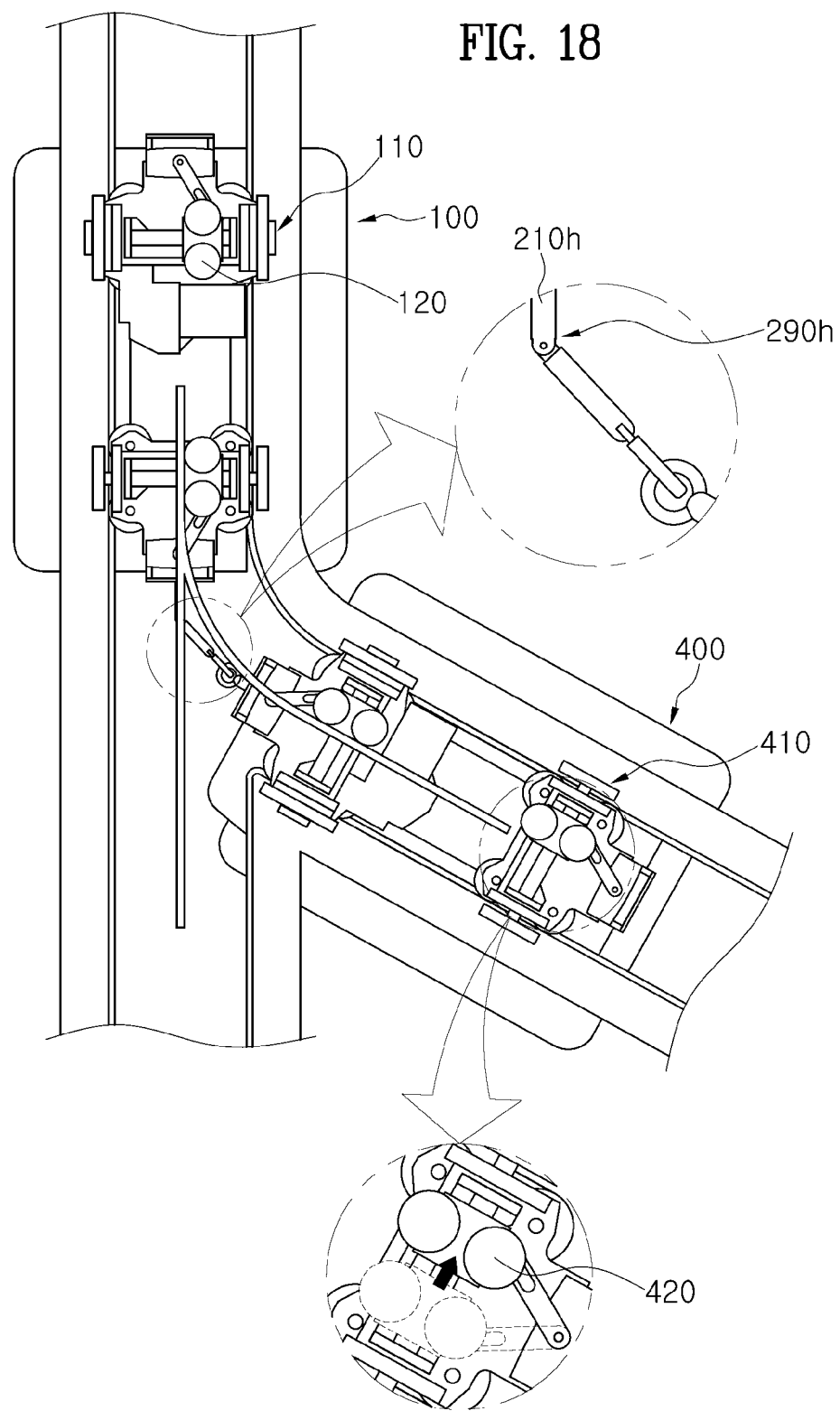
FIG. 18 shows an operation embodiment at a bend according to the method of managing an OHT system according to the present disclosure.

FIG. 18 shows an operation embodiment at a curved section according to the method of managing an OHT system according to the present disclosure.

When the OHT vehicle traction device 100 meets a bend while towing the driving-malfunction vehicle 400, it is required to control the steering device of the driving-malfunction vehicle 400 for smooth driving.

This operation is described with reference to FIG. 5. According to the present disclosure, the malfunction vehicle control unit 150 of the OHT vehicle traction device 100 can control the controller 465 of the driving-malfunction vehicle 400 by transmitting a wireless control signal through the wireless control communication module 450 of the driving-malfunction vehicle 400, whereby the operation of the steering device 410 of the driving-malfunction vehicle 400 can be controlled.

For example, when the OHT vehicle traction device 100 enters a bend, as shown in FIG. 18, the malfunction vehicle control unit 150 of the OHT vehicle traction device 100 can control the steering device 410 of the driving-malfunction vehicle 400 to fit to the direction of the bend.

In particular, since the OHT vehicle traction device 100 tows the driving-malfunction vehicle 400 ahead of the driving-malfunction vehicle 400 in the present disclosure, the OHT vehicle traction device 100 enters first a bend, so it is possible to find out the accurate timing when the following driving-malfunction vehicle 400 enters the bend. Accordingly, the OHT vehicle traction device 100 can control the steering device of the driving-malfunction vehicle 400 at the accurate timing.

Further, smooth turning may not be difficult due to the traction support member connecting the OHT vehicle traction device 100 and the driving-malfunction vehicle 400 to each other when passing through a bend. However, in the present disclosure, since the joint 290h that can rotate a portion of the traction support member left and right is provided at the traction support member 210h, smooth turning can be implemented.

That is, when passing through a bend, a portion of the traction support member can be rotated left and right by the joint 290h in accordance with the angle of the bend, so the driving direction of the OHT vehicle traction device 100 and the driving direction of the driving-malfunction vehicle 400 can be changed in accordance with the angle of the bend. Accordingly, smooth towing is possible even at a bend.

Further, FIG. 18 shows an embodiment of an operation relationship when an OHT vehicle traction device turns a bend while towing a driving-malfunction vehicle ahead of the driving-malfunction vehicle. However, a case in which an OHT vehicle traction device turns a bend while pushing a driving-malfunction vehicle from behind may be considered, but this is not described in detail.

As described above, according to the present disclosure, the traction unit of an OHT vehicle traction device and the traction jig fastener of a driving-malfunction vehicle can be fastened to each other in various types through various types of traction jigs, and particularly, the driving direction of an OHT vehicle traction device and the driving direction of a driving-malfunction vehicle can be changed to be different from each other through a joint at a bend, etc., so smooth towing is possible.

Figure 19:
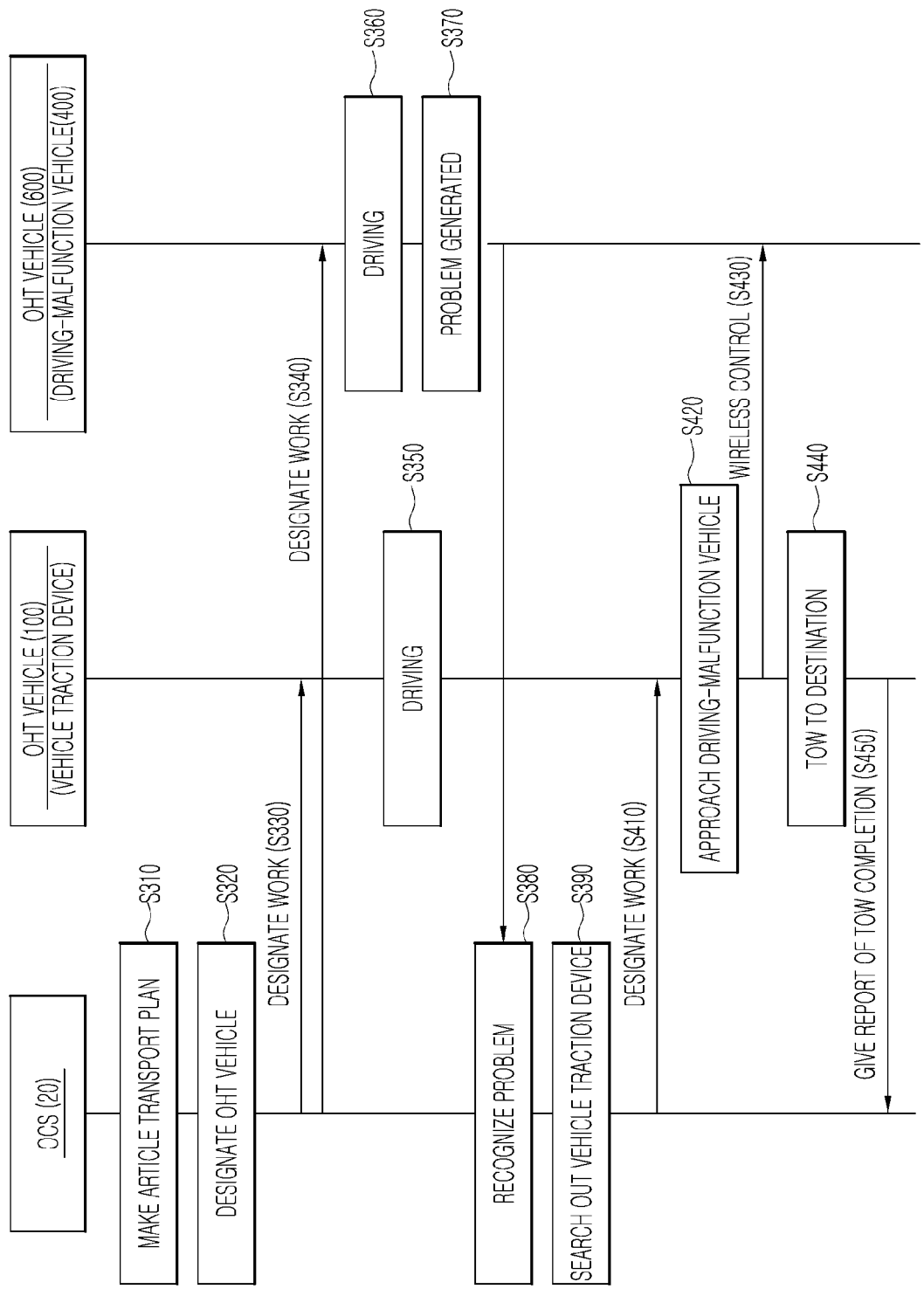
FIG. 19 is a flowchart illustrating another embodiment of the method of managing an OHT system according to the present disclosure.
Figure 20:
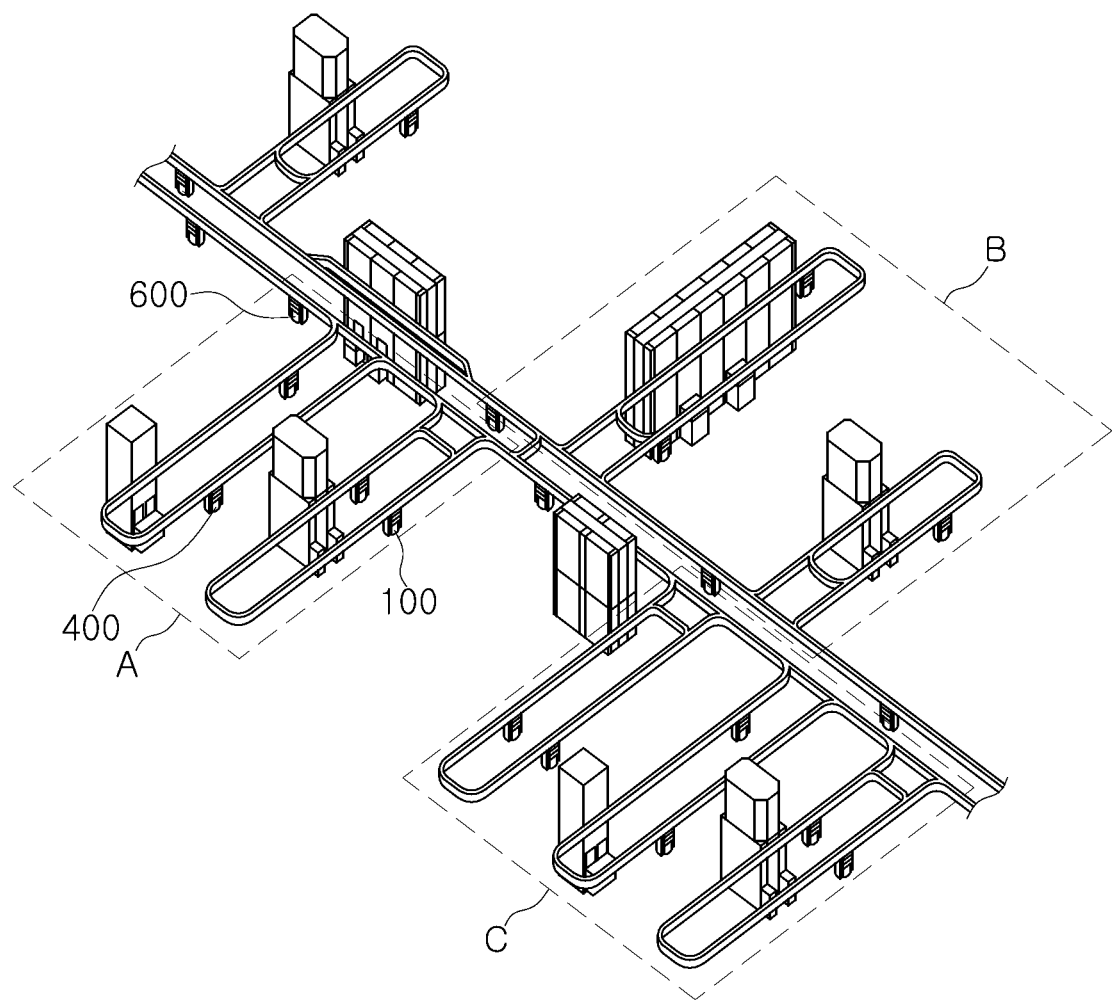
FIG. 20 shows an embodiment of designating an OHT vehicle traction device for each section in the method of managing an OHT system according to the present disclosure.

Further, the present disclosure provides a method that can more efficiently manage an entire OHT system, and in relation to the method, another embodiment of the method of managing an OHT system according to the present disclosure is described with reference to the flowchart shown in FIG. 19. FIG. 20 shows an embodiment of designating an OHT vehicle traction device for each section in the method of managing an OHT system according to the present disclosure, and is also referred to.

When the OCS 20 receives an instruction about transport for a work process from the MCS, the OCS 20 makes an article transport plan for transporting the article with a shortest time (S310), and searches out an appropriate OHT vehicle and designates the work to the OHT vehicle on the basis of the plan (S320).

According to the present disclosure, a work plane is made and designated such that OHT vehicle having the OHT vehicle traction device and normal OHT vehicles can be appropriately distributed when the transport plan using OHT vehicles is made. For example, it is possible to make a work plan such that OHT vehicle having the OHT vehicle traction device and normal OHT vehicles can be distributed within a predetermined ratio for each transport section, and designate work to the OHT vehicles.

For example, as shown in FIG. 20, transport sections may be divided into A, B, C, etc. and work may be applied to OHT vehicles. In this case, work is designated to the OHT vehicles such that OHT vehicles having the OHT vehicle traction device 100 and normal OHT vehicles 600 are distributed within a predetermined ratio for each transport section.

When such a work plan is made and work is designated to the OHT vehicles, the OCS 20 gives instructions to the OHT vehicle having the OHT vehicle traction device 100 and the normal OHT vehicles 600, respectively (S330 and S340).

The OHT vehicle having the OHT vehicle traction device 100 and the normal OHT vehicles 600 perform the work while running on each rail in accordance with the instructions from the OCS 20 (S350 and S360).

When a problem is generated in an OHT vehicle running on a rail (S370), the OCS 20 recognizes the location, etc. of the OHT vehicle 600 having the problem (S380) and gives an instruction to solve the problem by searching out (S390) an OHT vehicle 100 having an OHT vehicle traction device that is the most suitable for solving the problem of the OHT vehicle 600 (S410).

For example, when a driving-malfunction vehicle 400 is stopped on a rail as an OHT vehicle having a problem in FIG. 20, the OCS 20 gives an instruction to solve the problem by searching out the closest OHT vehicle 100 having an OHT vehicle traction device.

The OHT vehicle 100 having an OHT vehicle traction device moves to the corresponding location and approaches the OHT vehicle 400 having a problem in response to the instruction from the OCS 20 (S420). In this case, the OHT vehicle 100 having an OHT vehicle traction device approaches the front of the OHT vehicle 400 having the driving malfunction.

Further, the OHT vehicle 100 having an OHT vehicle traction device performs wireless control such as wireless power supply and resetting on the OHT vehicle having the problem by performing the process described above with reference to FIG. 12 (S430).

If the problem is solved, the OHT vehicle 100 having an OHT vehicle traction device performs its own work later, but if the problem is not solved, the OHT vehicle 100 having an OHT vehicle traction device wirelessly controls and tows the OHT vehicle 400 having the problem by performing the process described above with reference to FIG. 12.

The OHT vehicle 100 having an OHT vehicle traction device tows the OHT vehicle 400 having the problem to the destination (S440) and finishes towing by giving a report of tow completion to the OCS 20 (S450).

As described above, since work is designated such that OHT vehicles having an OHT vehicle traction device and normal OHT vehicles are distributed within a predetermined ratio for each transport section in the present disclosure, when a problem is generated in an OHT vehicle, it is possible to solve the problem within a short time, so it is possible to increase the management efficiency of the entire OHT system.

The above description merely explains the spirit of the present disclosure and the present disclosure may be changed and modified in various ways without departing from the spirit of the present disclosure by those skilled in the art. Accordingly, the embodiments described herein are provided merely not to limit, but to explain the spirit of the present disclosure, and the spirit of the present disclosure is not limited by the embodiments. The patent right of the present disclosure should be construed by the following claims and the scope and spirit of the disclosure should be construed as being included in the patent right of the present disclosure.

What is claimed is:

1. An overhead hoist transport (OHT) vehicle traction device comprising:
    a moving unit configured to be driven on a rail of an OHT system;
    a wireless power supply unit configured to wirelessly provide power to a driving-malfunction vehicle having a wireless power input unit;
    a traction unit configured to be engaged with a traction jig fastener of the driving-malfunction vehicle to tow the driving-malfunction vehicle;
    a traction jig fastener configured to be engaged with a traction unit of the driving-malfunction vehicle to tow the driving-malfunction vehicle;
    a traction jig controller; and
    a malfunction vehicle control unit,
    wherein the traction unit comprises:
    a traction support member protruding forward; and
    a traction jig mounted at an end of the traction support member and configured to be fastened to the traction jig fastener of the driving-malfunction vehicle,
    wherein the traction jig comprises:
    a hooked jig configured to be fastened to a ring-shaped traction jig fastener; and
    a rotary jig joint connected to an end of the hooked jig and configured to fasten or separate the hooked jig to or from the traction jig fastener by rotating the hooked jig,
    wherein the traction jig controller controls rotation of the rotary jig joint, and
    wherein the malfunction vehicle control unit is configured to:
    control the traction jig controller to couple the traction jig to the traction jig fastener;
    control the wireless power supply unit to wirelessly supply power to the driving-malfunction vehicle;
    wirelessly reset a controller of the driving-malfunction vehicle having a wireless control communication module;
    check whether the controller of the driving-malfunction vehicle is normally operated; and control the driving-malfunction vehicle via the wireless control communication module so that a brake of the driving-malfunction vehicle is released and a steering device of the driving-malfunction vehicle is controlled.

2. The OHT vehicle traction device of claim 1, wherein the traction unit further comprises:
a traction jig member room configured to receive and keep the traction support member, and
wherein the traction jig controller is configured to control the traction support member pulled out of or inserted into the traction jig member room.

3. The OHT vehicle traction device of claim 1, wherein the traction support member comprises a shock-absorbing member disposed at a middle portion or at an end of the traction support member and comprising an elastic member configured to absorb shock.

4. The OHT vehicle traction device of claim 1, wherein the traction support member comprises a joint formed at a middle portion of the traction support member and configured to rotate left and right a portion of the traction support member.

5. The OHT vehicle traction device of claim 1, wherein the OHT vehicle traction device is mounted on an OHT vehicle for transporting articles.

6. A method of managing an overhead hoist transport (OHT) system, the method comprising:
designating, by an OHT control system (OCS), a plurality of transport works to a plurality of OHT vehicles, respectively, wherein the plurality of OHT vehicles include a plurality of first type OHT vehicles having an OHT vehicle traction device and a plurality of second type OHT vehicles without an OHT vehicle traction device;
distributing, by the OCS, the plurality of first type OHT vehicles and the plurality of second type OHT vehicles at a predetermined ratio for each transport section;
recognizing a driving-malfunction vehicle having a problem on a rail of the OHT system;
designating, by the OCS, an OHT vehicle traction device by giving an instruction to the OHT vehicle traction device to solve the problem of the driving-malfunction vehicle, wherein the designating of the OHT vehicle traction device includes choosing one of the plurality first type OHT vehicle which is close to the driving-malfunction vehicle among the plurality of OHT vehicles;
approaching the OHT vehicle traction device to the driving-malfunction vehicle;
wirelessly supplying power to a wireless power input unit of the driving-malfunction vehicle and wirelessly resetting a controller through a wireless control communication module of the driving-malfunction vehicle, by the OHT vehicle traction device; and
checking whether the controller of the driving-malfunction vehicle is normally operated, by the OHT vehicle traction device.

7. The method of claim 6, further comprising:
coupling a traction unit and a traction jig fastener to each other by the OHT vehicle traction device; and
towing the driving-malfunction vehicle through the traction unit and the traction jig fastener by the OHT vehicle traction device.

8. The method of claim 7, wherein the towing of the driving-malfunction vehicle comprises:
releasing a brake through a wireless control communication module of the driving-malfunction vehicle by supplying power to a wireless power input unit of the driving-malfunction vehicle; and
controlling a steering device through the wireless control communication module of the driving-malfunction vehicle while towing the driving-malfunction vehicle.

9. The method of claim 8, wherein in the towing of the driving-malfunction vehicle, the steering device of the driving-malfunction vehicle is controlled in consideration of a bottleneck or a bend in a route from a location where the driving-malfunction vehicle is stopped to a destination where the driving-malfunction vehicle is to be repaired.

10. The method of claim 7, wherein the approaching of an OHT vehicle traction device includes moving the OHT vehicle traction device to the driving-malfunction vehicle within a possible-coupling distance between the traction unit and the traction jig fastener, and
wherein the coupling of the traction unit and the traction jig fastener to each other comprises:
pulling out a traction support member from a traction support member room; and
coupling a traction jig at an end of the traction support member to the traction jig fastener.

\* \* \* \* \*